(12) United States Patent
Dunford et al.

(10) Patent No.: US 12,226,822 B2
(45) Date of Patent: *Feb. 18, 2025

(54) ADDITIVE MANUFACTURING PROCESS OF 3D ELECTRONIC SUBSTRATE

(71) Applicant: Schlumberger Technology Corporation, Sugar Land, TX (US)

(72) Inventors: Steven O. Dunford, Missouri City, TX (US); Mark Kostinovsky, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/448,311

(22) Filed: Aug. 11, 2023

(65) Prior Publication Data
US 2023/0381863 A1 Nov. 30, 2023

Related U.S. Application Data

(63) Continuation-in-part of application No. 16/156,750, filed on Oct. 10, 2018, now Pat. No. 11,765,839.

(51) Int. Cl.
*B22F 10/25* (2021.01)
*B22F 1/00* (2022.01)
(Continued)

(52) U.S. Cl.
CPC ............ *B22F 10/25* (2021.01); *B22F 3/1035* (2013.01); *B22F 10/28* (2021.01); *B33Y 10/00* (2014.12);
(Continued)

(58) Field of Classification Search
CPC ........ B22F 10/25; B22F 10/28; B22F 3/1035; B22F 12/58; B22F 1/09; B22F 2302/45;
(Continued)

(56) References Cited

U.S. PATENT DOCUMENTS 4,544,611 A * 10/1985 Rellick ............... H05K 3/248
428/673
4,720,914 A * 1/1988 Maeda ............... H05K 3/1241
29/846
(Continued)

FOREIGN PATENT DOCUMENTS

| JP | 2014086398 A | * | 5/2014 |
| JP | 2014120678 A | | 6/2014 |
| KR | 1020160129522 A | | 11/2016 |

OTHER PUBLICATIONS

Hunziker et al, "High Performance Base Materials Made by Powder Coating Technology," 2008 3rd International Microsystems, Packaging, Assembly & Circuits Technology Conference, Taipei, Taiwan, 2008, pp. 344-347. (Year: 2008).*

(Continued)

*Primary Examiner* — A. Dexter Tugbang
(74) *Attorney, Agent, or Firm* — Jeffrey D. Frantz

(57) ABSTRACT

A method of forming electronic substrates and assemblies is provided. The method includes forming a first layer, including co-depositing a first material and a second material, where the first material and the second material are co-deposited as powders, binders, slurries, inks, or combinations thereof, and at least partially sintering or curing the first layer of co-deposited materials. Further, the method includes forming a second layer, including co-depositing the first material and the second material, and at least partially sintering or curing the second layer of co-deposited materials. Additionally, the method includes retrieving a solid electronic substrate wherein the sintered or cured first material of the first layer forms the solid electronic substrate and the sintered or cured second material of the first layer forms a feature in or on the solid electronic substrate.

17 Claims, 14 Drawing Sheets

(51) Int. Cl.
  *B22F 3/10* (2006.01)
  *B22F 10/28* (2021.01)
  *B33Y 10/00* (2015.01)
  *H05K 3/46* (2006.01)
  *B22F 12/58* (2021.01)
  *H05K 3/12* (2006.01)
(52) U.S. Cl.
  CPC .............. *H05K 3/4664* (2013.01); *B22F 1/09* (2022.01); *B22F 12/58* (2021.01); *B22F 2302/45* (2013.01); *H05K 3/1241* (2013.01)
(58) Field of Classification Search
  CPC .... H05K 3/1241; H05K 3/4664; H05K 3/248; B33Y 10/00
  See application file for complete search history.

(56) References Cited

U.S. PATENT DOCUMENTS

| | | | |
|---|---|---|---|
| 4,775,439 A * | 10/1988 | Seeger, Jr. | H05K 3/4664 |
| | | | 156/239 |
| 5,072,520 A | 12/1991 | Nelson | |
| 5,108,553 A | 4/1992 | Foster | |
| 5,358,825 A | 10/1994 | James | |
| 5,721,007 A | 2/1998 | Lynch | |
| 5,849,355 A | 12/1998 | McHenry | |
| 6,020,048 A * | 2/2000 | Oka | H05K 3/248 |
| | | | 428/209 |
| 6,035,527 A | 3/2000 | Tamm | |
| 6,515,218 B1 | 2/2003 | Shimizu | |
| 6,556,754 B2 | 4/2003 | Simmons | |
| 6,850,684 B2 | 2/2005 | Simmons | |
| 8,546,717 B2 | 10/2013 | Stecker | |
| 8,598,523 B2 | 12/2013 | Stecker | |
| 8,809,780 B2 | 8/2014 | Wollenhaupt | |
| 8,961,167 B2 | 2/2015 | Swanson | |
| 9,126,365 B1 | 9/2015 | Mark | |
| 9,149,988 B2 | 10/2015 | Mark | |
| 9,156,205 B2 | 10/2015 | Mark | |
| 10,600,739 B1 | 3/2020 | Herrault | |
| 2003/0038372 A1 | 2/2003 | Sasaki | |
| 2005/0215689 A1* | 9/2005 | Garbar | H05K 3/1241 |
| | | | 524/440 |
| 2006/0119669 A1* | 6/2006 | Sharma | H05K 3/4664 |
| | | | 347/82 |
| 2008/0224937 A1 | 9/2008 | Kimura | |
| 2011/0124299 A1 | 5/2011 | Koujima | |
| 2016/0057853 A1* | 2/2016 | Zacharko | H05K 1/09 |
| | | | 166/66 |
| 2016/0157341 A1 | 6/2016 | Lee | |
| 2016/0165721 A1 | 6/2016 | Kwon | |
| 2016/0198576 A1 | 7/2016 | Lewis | |
| 2019/0299518 A1 | 10/2019 | Armiento | |
| 2020/0120813 A1 | 4/2020 | Dunford et al. | |
| 2020/0256742 A1 | 8/2020 | Beckman | |
| 2020/0315035 A1 | 10/2020 | Shabtai | |

OTHER PUBLICATIONS

Deloitte, 2017, 3D Opportunity for Electronics, Additive Manufacturing Powers up, Deloitte University Press, A Deloitte series on additive manufacturing (20 pages).

Rahman et al., 2015, Aerosol based direct-write micro-additive fabrication method for sub-mm 3D metal-dielectric structures, Journal of Micromechanics and Microengineering, 25 (2015) (8 pages).

Office Action issued in U.S. Appl. No. 16/156,750 dated Oct. 5, 2021, 10 pages.

Office Action issued in U.S. Appl. No. 16/156,750 dated Mar. 31, 2022, 11 pages.

Hori, S. et al., "Fabrication of Oxide Thermoelectric Module Consisting of Multi-Layered Thick Films", 2006 25th International Conference on Thermoelectrics, 2006, pp. 480-483.

Office Action issued in U.S. Appl. No. 16/156,750 dated Jul. 18, 2022, 9 pages.

Office Action issued in U.S. Appl. No. 17/459,230 dated Nov. 25, 2022, 10 pages.

International Search Report and Written Opinion of PCT Application PCT/US2022/041047 dated Dec. 1, 2022, 11 pages.

Office Action issued in U.S. Appl. No. 16/156,750 dated Mar. 16, 2023, 12 pages.

Phenomena in Cross Section of Plated Through Holes, (2010) downloaded on May 4, 2023 from link, http://www.ipc.org/toc/plated-thru-hole-poster-DEMO.pdf (1 page).

* cited by examiner

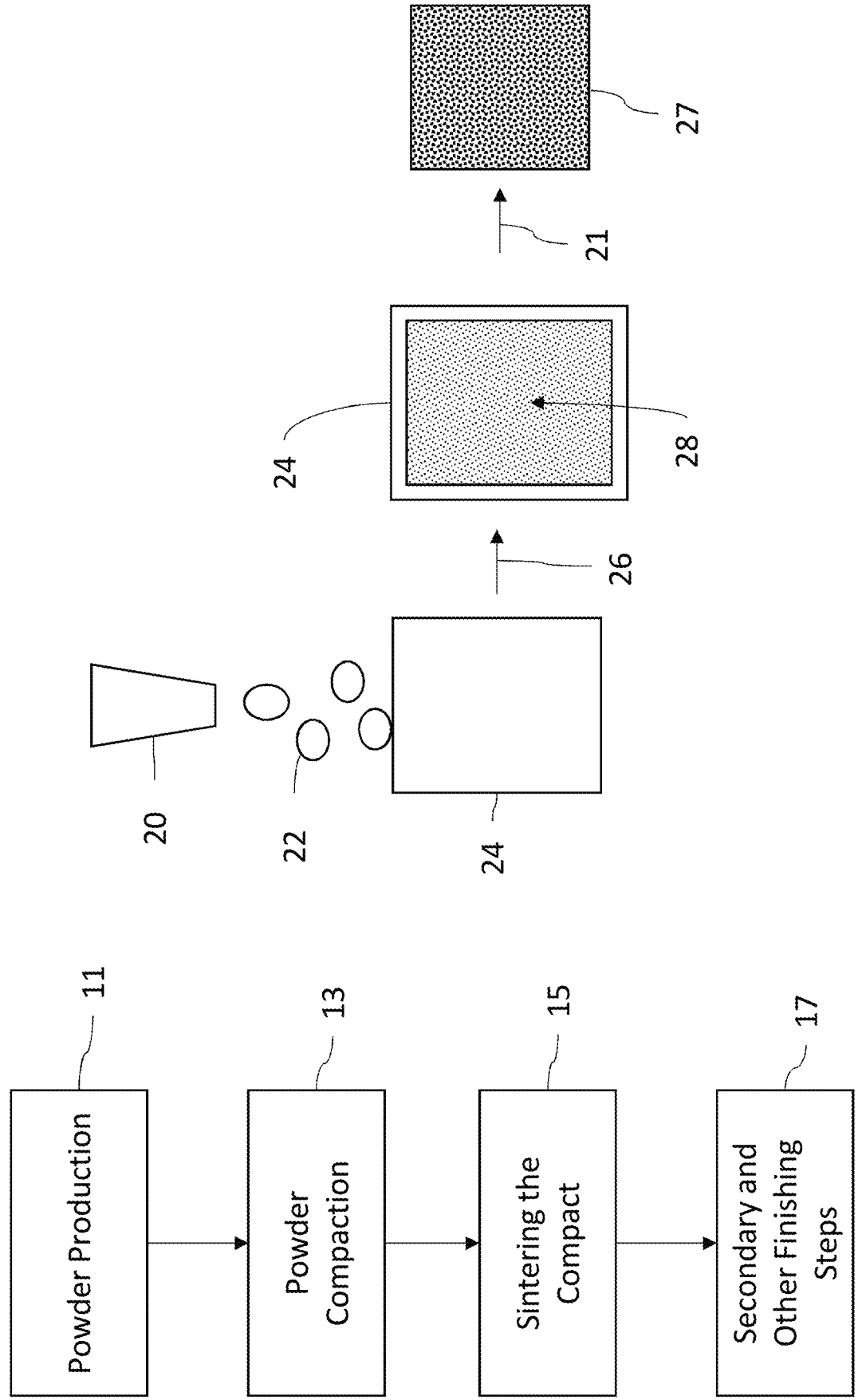

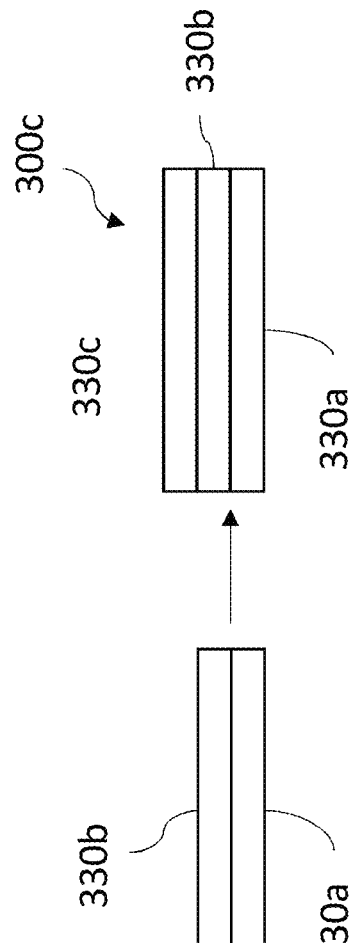

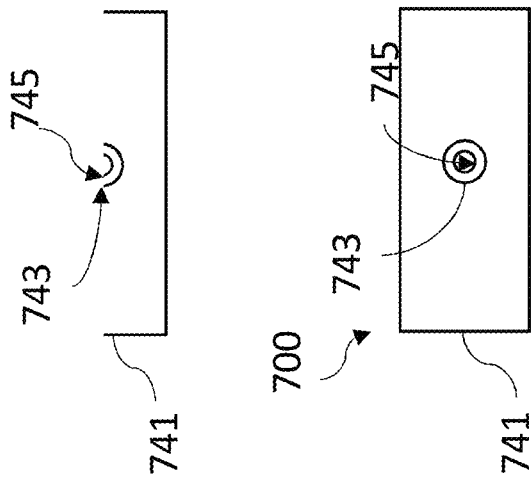
FIG. 7A
FIG. 7B
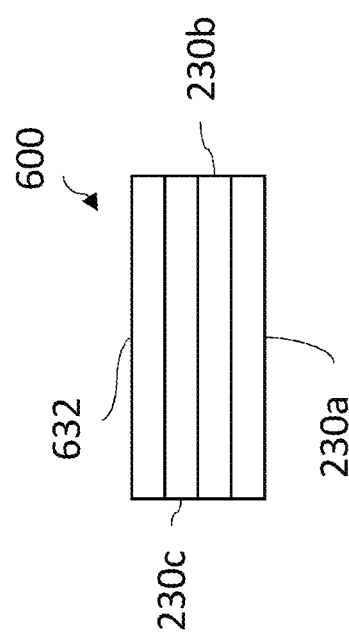
FIG. 6

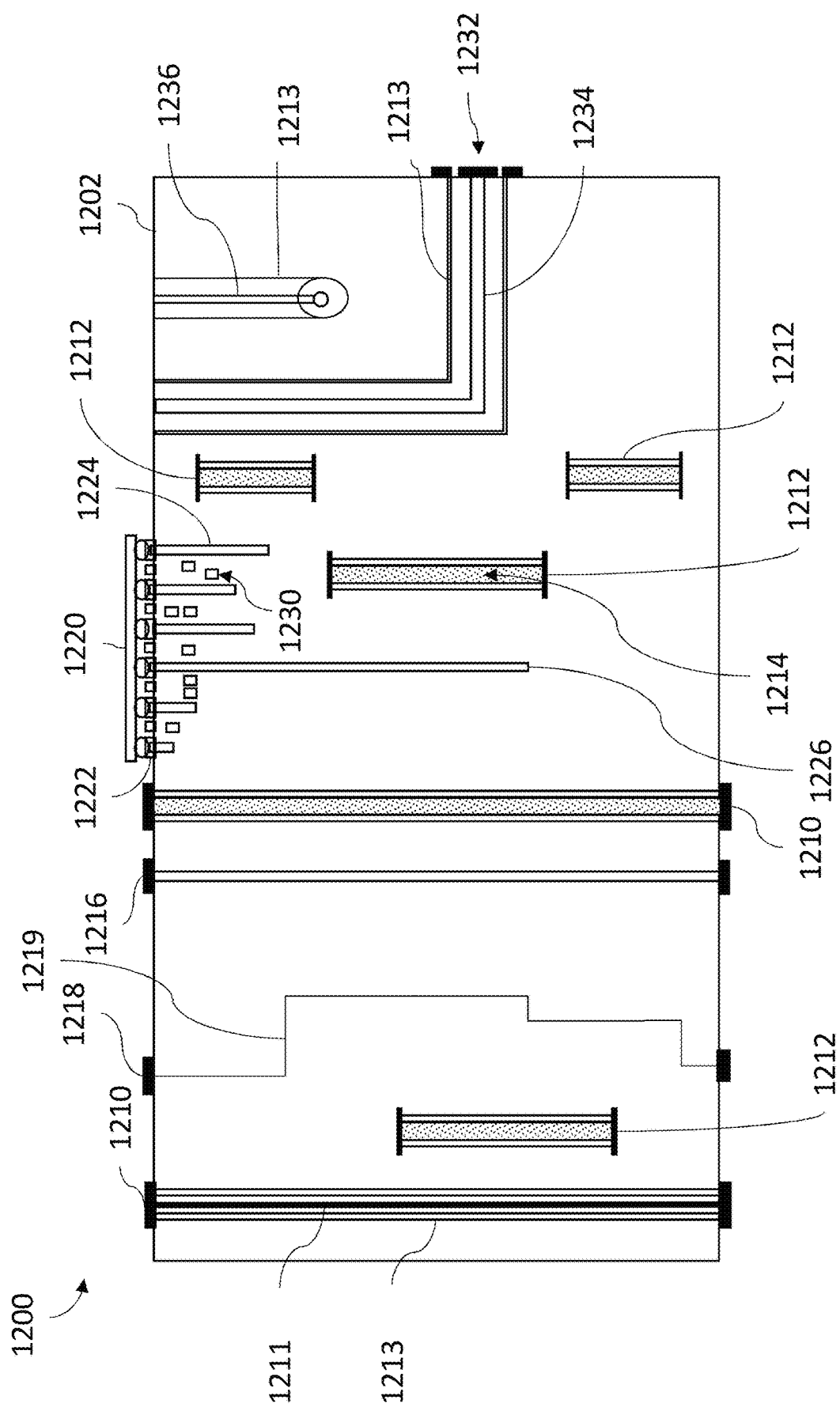

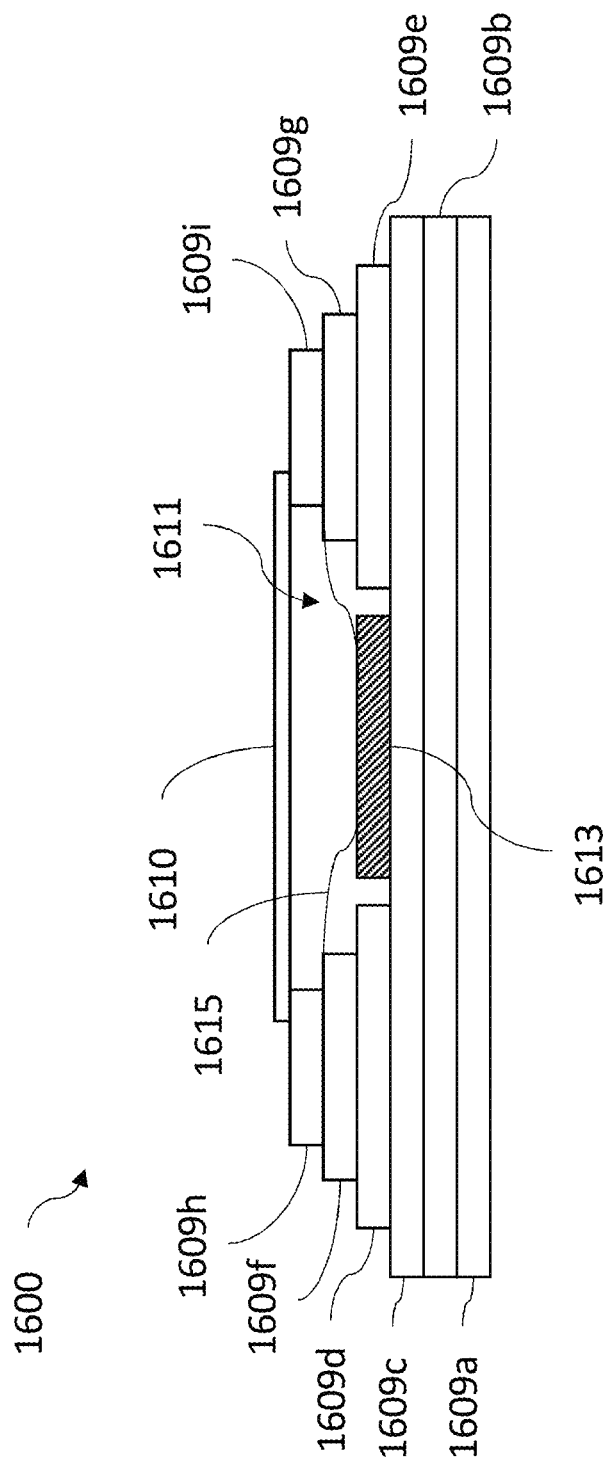

ADDITIVE MANUFACTURING PROCESS OF 3D ELECTRONIC SUBSTRATE

CROSS-REFERENCE TO RELATED APPLICATIONS

This application is a Continuation-In-Part of U.S. Non-Provisional application Ser. No. 16/156,750 filed on Oct. 10, 2018, which is hereby incorporated by reference in its entirety for all purposes.

FIELD

The present disclosure relates to additive manufactured, three-dimensional electronic substrates, to methods of additive manufacturing the same, to apparatus and systems including the same, and to methods of using the same.

BACKGROUND

Current industry practice in the production of electronic substrates is to build dielectric layers with electrical traces using materials such as GREENTAPE™ ceramics, resin-coated fiber materials, adhesives, pre-pregs, and/or dielectric films. Conductive traces are etched, plated, or printed onto the layers and into vertical interconnect accesses (vias). A via typically includes two pads (capture pads—internal, annular rings or solder pads—external), each positioned on a different layer of a multilayer electronic substrate; a barrel positioned within a hole through the layers of the substrate and connecting the pads; and a hole (antipad) extending through the barrel. Holes interconnecting circuits on different layers and side-to-side on the circuit board are drilled using mechanical drill bits and lasers, and the layers with conductive traces are aligned and cured in heated presses to form flat substrates for the electronic assembly. Additional connections are made with various additional processes including drilling, laser drilling, plating, printing, and additional lamination steps, for example. The substrates thus created include ceramic, organic, and flex substrates for electronic components, single and multi-chip modules (SCMs, MCMs), printed circuit boards (PCBs), printed wiring boards (PWBs), and flex and rigid flex PWBs. Attachment of electronic components to these substrates to create a functional printed wiring assembly (PWA) is limited in almost all cases to the primary side (top) and secondary side (bottom) of the substrate.

Production of such electronic substrates in accordance with current industry practice requires extensive time expenditures. For example, the cycle time to form such a substrate using current industry practices can range from two weeks to five weeks for production of PWBs of medium complexity and can range from four months to five months for MCM substrates that are relatively complex.

The Association Connecting Electronics Industries, also known as IPC, identifies numerous potential defects in current circuit boards and associated substrates in a cross-sectional depiction of a circuit board through hole via, which is available at http://www.ipc.org/toc/plated-thru-hole-poster-DEMO.pdf, as accessed on Aug. 1, 2018. Such potential known defects, as set forth in the above referenced IPC chart, include: A Undercut; B Outgrowth; C Overhang; 1 (Resin) Blistering; 2 Laminate Void; 3 (Resin) Delamination; 4 Pad Cratering; 5 Lifted Land Crack; 6 Burr; 7 Bond Enhancement removed—"Pink Ring"; 8 Negative Etchback; 9 Foil Crack; 10 Hole Plating Void; 11 Wedge Void; 12 Glass Fiber Void; 13 Glass Bundle Void; 14 Severe Etchback; 15 Nail Heading; 16 Drill Wall Tear/Wicking; 17 Hole Wall Pull Away; 18 Corner Crack; 19 (Copper) Blistering; 20 Burr Pushed Into Hole; 21 Glass Fiber Protrusion; 22 Innerlayer (Post) Separation; 23 Wicking; 24 Over Plating Resist Void; 25 (Positive) Etchback; 26 Barrel Crack; 27 Shadowing; 28 Nodule; 29 Resin Smear; 30 Copper & Over Plate Void; 31 Burned Plating; 32 Copper Foil Contamination; 33 Lifted Land; 34 Resin Crack Delamination; 35 Crazing; 36 Foreign Inclusion; 37 Prepreg Void; 38 Copper Clad Laminate Void; 39 Measling; 40 Resin Recession; 41 Glass-Weave Texture; and 42 Glass-Weave Exposure.

Also, in current industry practice, the capture pads of vias are made larger than electrically needed to prevent breakout during drilling or prevent missing the pad during laser drilling. Breakout occurs during drilling due to misalignment of sequential layers. The production of capture pads larger than electrically needed, in conjunction with maintaining minimum spacing between capture pads, limits the routing density (the number of conductive traces between vias) in the substrate.

Drill bits (and other equipment) used in current industry practice to produce such substrates are costly, limited in lifespan, and can break off in the holes within the substrate. Furthermore, tear-out of the resin and fibers in the holes by drill bits can create plating issues and delamination in and around the barrels of a via.

Current industry plating process limitations determine the minimum via and hole (antipad) size. If the through hole is too small, the ends of the holes plate-shut leaving a void that can retain plating fluids.

Furthermore, the coefficient of thermal expansion (CTE) of the materials used to fill blind vias (vias that include only one exposed pad) and buried vias (vias without any exposed pads) in a PWB can be, for example, from two to three times greater than the CTE of the PWB. Expansion and/or contraction of such fill materials can cause barrel cracking, post-separation in the surrounding Cu plating of the PWB, and delamination of copper capped vias.

Changes to such substrates can require the modification and re-creation of each layer, such that each layer must be rebuilt. This can add weeks to the delivery time of the completed circuit board.

BRIEF SUMMARY

One embodiment of the present disclosure includes a method of forming electronic substrates and assemblies. the method of forming electronic substrates and assemblies includes forming a first layer, wherein forming the first layer comprises co-depositing a first material and a second material, wherein the first material and the second material are co-deposited as powders, binders, slurries, inks, or combinations thereof to form the first layer. Further, the method includes at least partially sintering or curing the first layer of co-deposited materials. Furthermore, the method includes forming a second layer, wherein forming the second layer comprises co-depositing the first material and the second material, wherein the first material and the second material of the second layer are co-deposited as powders, binders, slurries, inks, or combinations thereof to form the second layer. Moreover, the method includes at least partially sintering or curing the second layer of co-deposited materials. Additionally, the method includes retrieving a solid electronic substrate wherein the sintered or cured first material of the first layer forms the solid electronic substrate and the sintered or cured second material of the first layer forms a feature in or on the solid electronic substrate.

Another embodiment of the present disclosure includes a solid electronic substrate formed in accordance with the methods disclosed herein.

Another embodiment of the present disclosure includes a method of deploying a solid electronic substrate formed in accordance with the methods disclosed herein, in a downhole well.

BRIEF DESCRIPTION OF THE DRAWINGS

So that the manner in which the features of the compositions, articles, apparatus, systems and methods of the present disclosure may be understood in more detail, a more particular description briefly summarized above may be had by reference to the embodiments thereof which are illustrated in the appended drawings that form a part of this specification. It is to be noted, however, that the drawings illustrate only various exemplary embodiments and are therefore not to be considered limiting of the disclosed concepts as it may include other effective embodiments as well.

FIG. 1 depicts a simplified AM powder manufacturing flow chart.

FIGS. 2A-2C depict a simplified AM powder manufacturing system and process.

FIGS. 3A-3C depict a sequence of construction of a three-layer electronic substrate.

FIG. 6 depicts a laminate printed onto an electronic substrate.

FIGS. 7A and 7B depict the manufacture of an electronic substrate including shielded wiring.

FIG. 12 depicts an exemplary electronic assembly.

FIG. 16 depicts an exemplary electronic assembly with a lid.

Figure 4B:
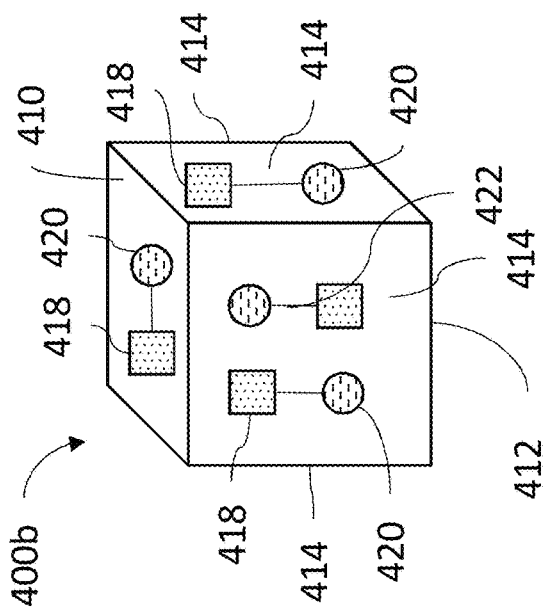
FIG. 4B depicts a perspective view of a generally cubic electronic substrate in accordance with certain aspects of the disclosure.

Compositions, articles, systems, and methods according to present disclosure will now be described more fully with reference to the accompanying drawings, which illustrate various exemplary embodiments. Concepts according to the present disclosure may, however, be embodied in many different forms and should not be construed as being limited by the illustrated embodiments set forth herein. Rather, these embodiments are provided so that this disclosure will be thorough as well as complete and will fully convey the scope of the various concepts to those skilled in the art and the best and preferred modes of practice.

DETAILED DESCRIPTION

Certain aspects of the present disclosure provide for additive manufactured three-dimensional electronic substrates; to articles, machines, assemblies, apparatus, and systems including the same; to methods of additive manufacturing the same; and to methods of using the same.

Additive Manufacturing of Three-Dimensional Electronic Substrates

Certain aspects of the present disclosure include methods of additive manufacturing (AM) three-dimensional (3D) electronic substrates, as well as to electronic substrates made thereby. The method includes the use of additive manufacturing technologies, such as 3D printing and powder sintering, to build electrical interconnecting structures such as are used for the interconnection of electronic components on electronic substrates, including printed wiring boards (PWBs) and printed wiring. In some such aspects, the method includes building the electronic substrates and associated structures without the use of processes that include laminating multiple independent layers. As will be evident from the disclosure herein, the AM techniques disclosed herein provide for the manufacture of electronic substrates of variable shapes. The electronic substrates thus formed may be configured for attachment of electronic components, solder pads, interconnections, and other such elements to any side of the electronic substrate and may be configured for traces to be positioned and extend on any side and at any angle and direction on the electronic substrate. The method may also be used to build functional components in, on, or into the electronic substrate, such as by 3D printing over the top of semiconductors, integrated circuits, resistive and other electronic materials and components.

The AM methods disclosed herein may be used to additive manufacture electronic substrates in a traditional flat format to take advantage of the current electronic assembly process infrastructures. However, as additive manufacturing is not restricted to manufacturing only flat format electronic substrates with components on only two sides thereof, the AM methods may also be used to additive manufacture electronic substrates of variable shapes, providing for attachment of components to any side of the electronic substrate, as discussed in more detail below.

Powder Deposition and Sintering

In certain aspects, the method includes depositing a material on a surface or in a mold, followed by sintering the material on the surface or within the mold. In some aspects, a mold is not used. In some such aspects, where a mold is not used, support for undercuts or other features that may deform before cured, if unsupported, may be provided by a support material or by uncured or unbonded powder bed, for example. However, in other embodiments, a mold may be used to compact and condense the material during sintering to improve the final properties.

The materials deposited and used in the additive manufacturing of the electronic substrates disclosed herein may be a powder (i.e., powder deposition) or mixture of powders; a slurry, such as a powder slurry or paste (also referred to as a thick film); an ink, such as conductive ink (including TLPS materials), including conductive metal powders mixed with one or more of various materials such as graphene or other carbon materials; or combinations thereof. In some embodiments, the powder is a nanopowder, which is a powder where all, or a majority of, or at least a plurality of the constituent particles of the powder has a particle size (average particle diameter) of less than 100 nm or less than 50 nm. The materials deposited and used in the additive manufacturing may also include non-conductive materials, dielectric materials, and/or other materials to support and/or surround the deposited conductive materials that form the circuits disclosed herein.

The sintering may include laser sintering, such as selective or direct laser sintering, or another sintering method known in the art. Sintering may include using any of a number of heat sources capable of providing sufficient thermal energy to melt the materials, including the use of lasers or other concentrated light sources (e.g., soft beams), ovens, and furnaces. In some embodiments, the sintering includes transient liquid-phase sintering (TLPS) materials and/or processes. In some aspects, the electronic substrate is built in deposited layers. Each layer may range from 1 μm to 3 mm, or from 20 μm to 2 mm, or from 100 μm to 1 mm in thickness. For example, the method may include depositing a first portion of a material, such as onto a surface or within the mold; sintering the first portion of the material on the surface or within the mold; depositing a second portion of the material and on top of the sintered first portion of the material; and sintering the second portion of the material. This procedure can be continued until the final article (e.g., electronic substrate) is formed and removed from a support form or material or is retrieved from a mold. One skilled in the art would understand that the layers are not limited to these exemplary ranges, and may be thicker or thinner, depending on the particular application. Each layer of the electronic substrate may be composed of the same material as adjacent layers or of a different material than adjacent layers. As would be understood by those skilled in the art, TLPS is an interconnection process using a mixture of materials in combination with laser sintering to fuse particles of dissimilar materials together to manufacture solid structures without having to reach the melting point of all of the constituent materials in the mixture of materials. In TLPS, a mixture of materials is used that includes at least one relatively low-melting point material and at least one relatively higher-melting point material. When sintered, the relatively low-melting point material melts, which facilitates the at least partial melting of the other relatively higher-melting point material(s), resulting in the formation of an alloy and/or matrix and/or aggregate material of the various materials in the mixture. With the inclusion of at least one relatively higher-melting point material in the mixture, the resultant substrate portion or component formed therefrom (e.g., an interconnect or joint) has a higher-melting point than an otherwise identical part that lacks the higher-melting point material. Thus, use of TLPS provides the ability to form electronic substrates, components, and associated parts that have relatively high melting points and are, thus, suitable for use in relatively high-temperature environments, such as downhole environments.

With reference to FIG. 1, powder deposition and sintering includes powder production, box 11. Powder production may include selection of powder for use in construction of the parts. The selected powder may be a single constituent powder, such as a powder that is 100 percent by weight (wt. %) of a single material. In other aspects, the powder is a mixture of multiple, different powders. When the powder is a mixture of multiple, different powders, powder production may include blending or otherwise mixing the multiple, different powders together. After powder production, the method includes powder compaction, box 13. For example, the powder may be deposited and then subjected to compaction. Powder compaction can include, but is not limited to, pressing the powder with dies, isostatic compaction of the powder, cold isostatic pressing, or other methods known to those skilled in the art. After compaction, the method includes sintering of the compact, box 15. Sintering may include, but is not limited to, TLPS. Compaction and sintering results in a consolidation and/or fusing of the particles that make up the powder. Thus, after compaction and sintering, the material is no longer in particulate or powder form, but is a bulk, solid part. While described herein as separate steps, in some aspects compaction and sintering occur and/or are performed concurrently (e.g., simultaneously). The method may then include any of numerous possible secondary and other finishing steps, box 17, as would be understood by one skilled in the art. In some embodiments, the method does not include a compaction step. Further, in some embodiments, the method includes a curing step in addition to or instead of a sintering step.

The material used to form the articles disclosed herein may include one or multiple materials, which may be mixed and deposited together, or may be deposited and sintered or cured discretely from one another. For example, the material may include a first material (e.g., a dielectric material) that is deposited and sintered or cured at positions on a surface, in a support form, or within the mold that are discrete from the positions where one or more additional materials are deposited and sintered or cured. The sintered or cured first material may form the electronic substrate, or body thereof, and the sintered or cured additional materials may form a feature in or on the electronic substrate. The feature may be or include a signal trace, an interconnection (electrical or thermal), a reinforcing boss, a stiffener, a twisted wire pair, a coaxial cable, a wire, a thermal sensor, an antenna, a contact pad, a via, a wrapped inductor core, or another feature.

In one or more embodiments, the material used to form the articles disclosed herein may additionally include materials that increase the catalytic activity of electroconductive areas of the substrate. These materials may aid in the formation of an electroconductive layer on an external surface of the substrate. The materials may include metal particles, oxides, borides, phosphides, carbides, or metal-organic compounds that aid in the formation of an electroconductive layer. By way of example, the material used to form the articles may include, but is not limited to, metal particles such as ruthenium, rhodium, palladium, rhenium, platinum, osmium, iridium, gold, and silver. Further, in one or more embodiments, by way of example, the material may include, but is not limited to, metals in different chemical compound forms such as oxides, borides, phosphides, or carbides such as ruthenium (IV) oxide, rhodium (III) oxide, palladium (II) oxide, rhenium (VI) oxide, or platinum (IV) oxide. Furthermore, in one or more embodiments, by way of example, the material may include, but are not limited to, metal-organic compounds of one of ruthenium, rhodium, palladium, rhenium, platinum, osmium, iridium, gold, or silver. As discussed above, these additional materials may be mixed and deposited together with other materials or may be deposited and sintered or cured discretely from the other materials.

Thus, in one or more embodiments, the material may include a first material (e.g., a dielectric material) that is deposited and sintered or cured at positions on a surface, in a support form, or within the mold that are discrete from the positions where a second material is deposited and sintered or cured. The sintered or cured first material may form the electronic substrate, or body thereof, the sintered or cured second material may form a feature in or on the electronic substrate and/or aid in the formation of an electroconductive layer on an external surface of the substrate. The feature formed by the second material may be or include a signal trace, an interconnection (electrical or thermal), a reinforcing boss, a stiffener, a twisted wire pair, a coaxial cable, a wire, a thermal sensor, an antenna, a contact pad, a via, a wrapped inductor core, or another feature. While the materials that increase the catalytic activity of electroconductive areas of the substrate may be included in the second material that is used to form a feature in or on the electronic substrate, in other embodiments, the materials that increase the catalytic activity of electroconductive areas of the substrate may be included as a third material and may be co-deposited with the first material and second material. Further, in one or more embodiments, the first material, the second material, and the third material may be co-deposited and sintered or cured within each layer. However, in other embodiments, the first material, second material, and third material may be co-deposited in a first layer and sintered or cured and then the first material and second material may be co-deposited, without a third material, in a second layer and subsequent layers and sintered or cured.

In one or more embodiments, the materials that increase the catalytic activity of electroconductive areas of the substrate, which may be included in the second material or as a third material, may aid in the creation of multilayer electronic circuit assemblies where non-electrically conductive materials are co-deposited with electroconductive materials to form interconnecting electrical circuits and/or thermal management solutions. The materials that increase the catalytic activity of electroconductive areas of the substrate, which are co-deposited with the first material, an electrically insulating material, may enhance the adhesion, bonding, or attachment between the conductive elements and the dielectric materials. The materials that increase the catalytic activity of electroconductive areas of the substrate may additionally enhance layer-to-layer interconnectivity of features formed by the second material, such as vias. Additionally, the materials that increase the catalytic activity of electroconductive areas of the substrate may facilitate the subsequent plating (i.e., metallization of circuits) by accelerating initiation of the plating process.

Typically, in one or more embodiments, the plating process includes applying seed layers for plating in separate process steps including by sputter coating and/or vapor deposition of catalytic metals. However, in one or more embodiments, the co-depositing of materials that increase the catalytic activity of electroconductive areas of the substrate with the first material in the substrate formation process has the benefits of eliminating the separate seed layer processing steps and creating uniform seed layers for any complex structure. Eliminating the separate seed layer processing step helps eliminate shadowing issues caused by sputtering being a largely line-of-site process. Additionally, in one or more embodiments, plating may be used to add barrier layers that limit diffusion, add corrosion resistance, add abrasion resistance, and/or adjust the coefficient of thermal expansion. Furthermore, plating may be used to build up the dimensions of conductors to improve current carrying capabilities, improve the strength or durability of the conductors, or repair or alter conductors as needed.

FIGS. 2A-2C are schematics illustrating the making of a substrate from a powder. In some aspects, the substrates are formed via a binder jetting process. Powder material 22 is dispensed from hoppers 20 onto surface 24. Powder material 22 is subjected to compaction processing 26, forming compacted powder 28. Compacted powder 28 is then subjected to sintering 21 to form sintered substrate 27. One skilled in the art would understand that the above discussion of the method is for exemplary and explanatory purposes, and that the methods disclosed herein are not limited to performing these particular steps in this particular order. Rather, one skilled in the art would understand that certain steps combined or eliminated, and other steps may be added without departing from the scope of this disclosure.

With reference to FIGS. 3A-3C, the manufacturing of an exemplary three-layer electronic substrate 300c is depicted. Material for a first layer is deposited and sintered, forming first layer 330a, followed by deposition and sintering of material to form second layer 330b, followed by deposition and sintering of material to form third layer 330c; thereby manufacturing electronic substrate 300c. One skilled in the art would understand that the electronic substrate 300c and layers 330a-330c thereof shown in FIGS. 3A-3C are simplified for the purposes of illustration and are not limiting as to the structure, arrangement, number of layers, or manufacture of the electronic substrates disclosed herein. Further, while in one or more embodiments each layer is deposited and then sintered or cured before another layer is deposited, in other embodiments, each layer may be deposited and partially sintered or cured until all layers have been deposited, at which time the sintering or curing process is completed for all layers at the same time. Additionally, in other embodiments, any combination of partial or complete sintering or curing of each deposited layer may be used.

The use of material (e.g., powder) deposition in combination with sintering (e.g., laser sintering) or curing to manufacture the electronic substrates disclosed herein can, in at least some embodiments, be used to: manufacture electronic substrates in fewer process steps than are used in current industry practices to produce electronic substrates; reduce the cycle time required to manufacture electronic substrates in comparison with the cycle time of current industry practices to produce electronic substrates; reduce or eliminate defects that are otherwise typically introduced to the electronic substrate produced in accordance with current industry practices; or combinations thereof. In some such embodiments, the cycle time to additive manufacture relatively large metal components of relatively complex geometries using direct laser sintering AM processes, as disclosed herein, is from three to ten days, or from four to eight days, or any range therebetween. In some aspects, a relatively complex MCM substrate may be formed using the AM processes disclosed herein in at most one month, or at most three weeks, or at most two weeks, or less than two weeks. In contrast, some current industry practices require multiple months to manufacture relatively complex MCM substrates.

Furthermore, the use of material deposition in combination with sintering to manufacture the electronic substrates disclosed herein can, in at least some embodiments, be used to incorporate relatively high-melting point materials into the final fused structure of the electronic substrates without having to reach the melting temperature of the relatively high-melting point materials (e.g., via use of TLPS). The properties of the material are incorporated into the fused solid. In some such embodiments, electronic substrates formed at relatively lower temperatures in accordance with the present methods will be suitable for deployment and use at temperatures that are higher than are required for the initial formation of the electronic substrates. For example, solder joints, other electrical or thermal interconnects, and/or other electronic components of the electronic substrates may be formed at relatively low temperatures, while being suitable for deployment and use in relatively high temperature applications (e.g., downhole applications) without melting in such high-temperature environments.

In some embodiments, material deposition and sintering are used in near net shape additive manufacturing of the electronic substrates, such that the electronic substrates, or selected portions thereof, exhibit uniform or substantially uniform properties. With such near net shape additive manufacturing techniques, any or nearly any shape of electronic substrate can be manufactured, such that the electronic substrates are not limited to flat structures such as those currently used for printed wiring boards.

Three-Dimensional Electronic Substrates—Shapes

Figure 4C:
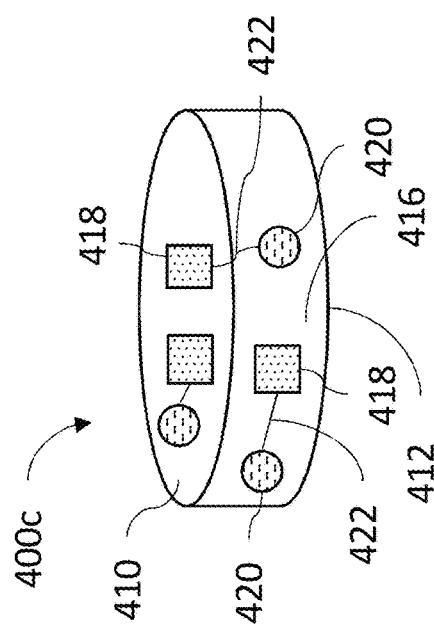
FIG. 4C depicts a perspective view of a generally cylindrical electronic substrate in accordance with certain aspects of the disclosure.
Figure 4A:
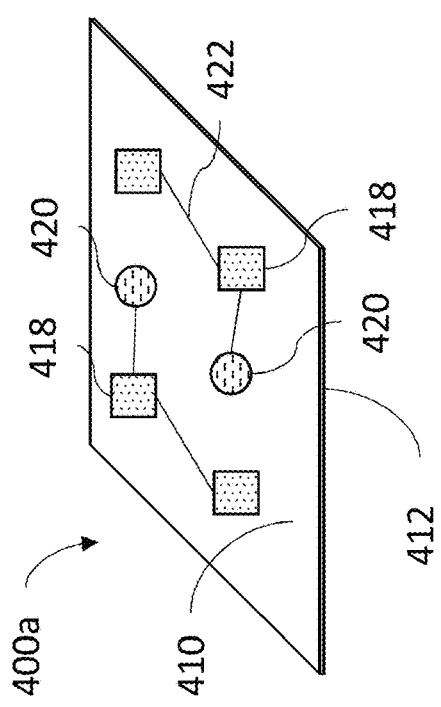
FIG. 4A depicts a perspective view of a flat electronic substrate in accordance with certain aspects of the disclosure.

While electronic substrates disclosed herein may have the traditional flat format, suitable for use with current assembly process infrastructures, the electronic substrates disclosed herein are not limited to the traditional flat format and may have any shape or form achievable using additive manufacturing (AM) techniques. With reference to FIGS. 4A-4C, three exemplary electronic substrates of different shapes are shown. FIG. 4A depicts electronic substrate 400a which has the shape and form of a traditional flat substrate. As would be understood by one skilled in the art, to create a functional printed wiring assembly (PWA) with a traditional flat substrate, such as is shown in FIG. 4A, electronic components 418 can typically only be attached to the primary side (top) and secondary side (bottom) of the substrate, here shown as top side 410 and bottom side 412, respectively. FIG. 4B depicts a non-traditional substrate in the shape of a cube, electronic substrate 400b. Like electronic substrate 400a, electronic substrate 400b can have electronic components 418 attached to top side 410 and bottom side 412. However, in addition to top side 410 and bottom side 412, electronic substrate 400b can have electronic components 418 attached to tertiary sides 414. FIG. 4C depicts a non-traditional substrate in the shape of a cylinder, electronic substrate 400c. Like electronic substrates 400a and 400b, electronic substrate 400c can have electronic components 418 attached to top side 410 and bottom side 412. However, in addition to top side 410 and bottom side 412, electronic substrate 400c can have electronic components 418 attached to curved side 416. One skilled in the art would understand that the electronic substrates disclosed herein are not limited to the particular shapes shown in FIGS. 4A-4C and that, through the use of additive manufacturing, the electronic substrates can be made to have any number of shapes. For example, and without limitation, the electronic substrates may have the shape of a prism (rectangular, triangular, hexagonal), pyramid (square, rectangular, triangular, hexagonal), cylinder, cone, sphere, torus, any regular or irregular polygon, or any other shape achievable via use of additive manufacturing. Furthermore, one skilled in the art would understand that the electronic substrates disclosed herein are not limited to have regular geometric shapes and may have any shape or configuration depending on the particular application.

Figure 4E:
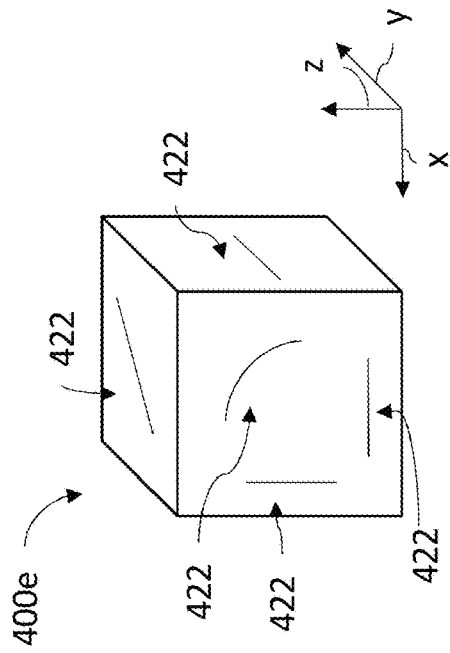
FIG. 4E depicts a perspective view of a generally cubic electronic substrate showing the various directions that traces can extend in accordance with certain aspects of the disclosure.
Figure 4G:
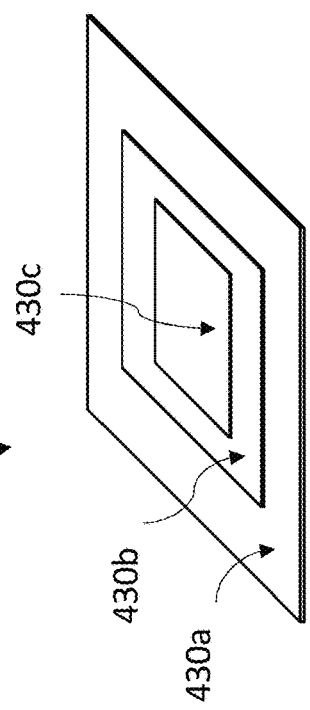
FIG. 4G depicts a perspective view of stacked, nested electronic substrates in accordance with certain aspects of the disclosure.
Figure 4D:
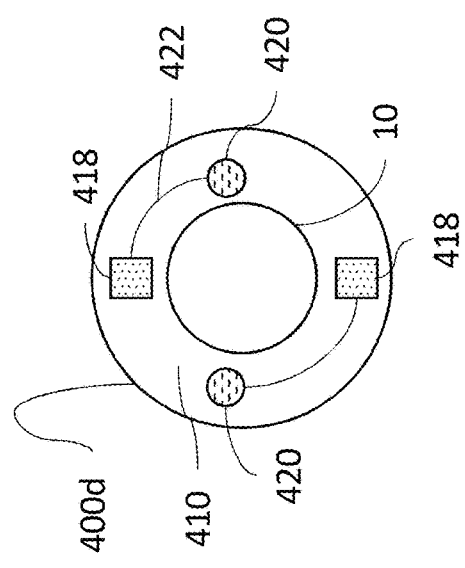
FIG. 4D depicts a top view of a generally ring-shaped electronic substrate in accordance with certain aspects of the disclosure.

In some aspects, the electronic substrates disclosed herein may have a shape specifically designed and configured to mate with or attach to another component or to fit within a specific space. For example, FIG. 4D depicts a top view of electronic substrate 400d having an annular or ring-shaped profile on top side 410, such that electronic substrate 400d is shaped to precisely fit about component 10. Component 10 may be a downhole component, such as a tubing, piping, or any other downhole tool or component. Thus, at least some embodiments of the electronic substrates disclosed herein may have electronic components attached to any side thereof, as the electronic components disclosed herein are not limited to being traditionally formatted flat substrates with connections to electronic components on only two sides thereof. Each electronic component 418 is shown electrically coupled with a via 420 by a trace 422. One skilled in the art would understand that the electronic components are shown as squares 418, the vias are shown as circles 420, and the traces are shown as lines 422 in FIGS. 4A-4D for the purposes of illustration only and are merely representative of any of electronic components typically attached to the electronic substrates. As would be understood by one skilled in the art, the electronic substrates disclosed herein may include circuit interconnect structures allowing communication between electronic components of all types. For example, twisted wire pairs with shielding, coax cable connections, inductor cores and wraps, reinforcing bosses, stiffeners, wires, connectors, flex circuits, circuit boards, dies, integrated circuits, solder joints, solder pads, conductive interconnects, thermal interconnects, and any other device used to connect electronic components and circuitry to complete an electronic assembly may be included with or used in conjunction with the electronic substrates disclosed herein. Furthermore, each of such devices may be coupled with any side of the electronic substrate and are not limited to being coupled with only two sides (the primary and secondary sides). Also, one or more of such electronic devices or components may be integrally formed with the electronic substrate using AM methods, such as by depositing powder material to form the component.

As is evident in FIGS. 4A-4D, the electronic substrates disclosed herein may include traces 422 that extend in any direction on any of the surfaces of the electronic substrates, including lateral (x-direction), longitudinal (y-direction), vertical (z-direction), diagonal (relative to x-, y-, and z-directions), and curvilinear or arcuate traces. For example, FIG. 4E depicts assembly 400e including traces 422 extending in various directions, including linear and curvilinear traces.

Figure 4F:
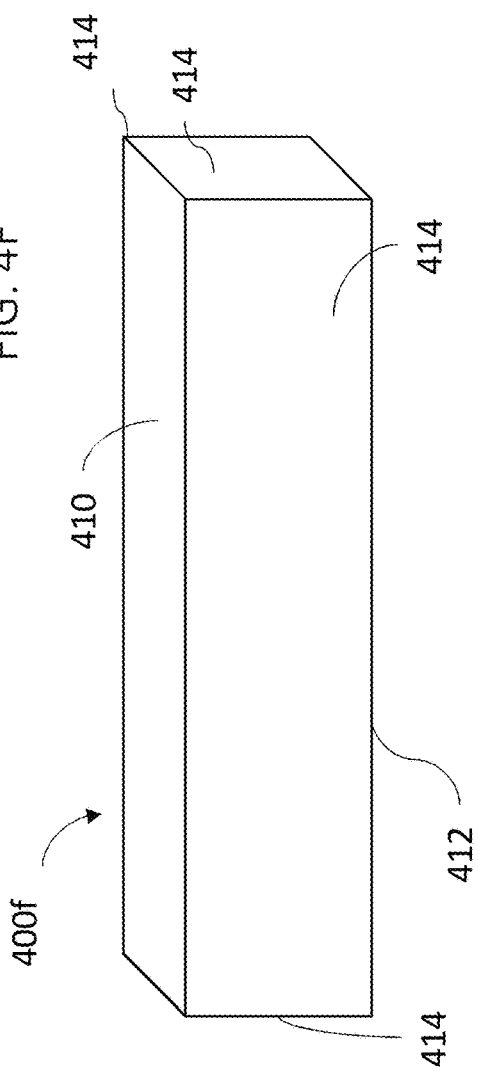
FIG. 4F depicts a perspective view of a rectangular prism shaped electronic substrate in accordance with certain aspects of the disclosure.

In some aspects, the electronic substrates disclosed herein are hollow structures, such as is shown in FIG. 4F. Electronic substrate 400f may include top side 410, bottom side 412, and tertiary sides 414 coupled together. An interior of electronic substrate 400f, defined by sides 410, 412, and 414, may be a hollow cavity.

In some aspects, the electronic substrates disclosed herein are nested structures. FIG. 4G depicts electronic substrate 400g, including substrate element 430a coupled with substrate elements 430b and 430c in a nested arrangement. Each of substrate elements 430a-430c may be the same or substantially the same as substrate 400a as shown in FIG. 4A. One skilled in the art would understand that the nested substrates disclosed herein may have other forms, shapes, and arrangements and are not limited to the particular form, shape or arrangement shown in FIG. 4G.

Three-Dimensional Electronic Substrates—Materials

In certain aspects, the AM processing techniques disclosed herein are used to tailor the material properties of the electronic substrate, or portions thereof, to eliminate stresses in the electronic substrate. For example, ceramic materials may be used to manufacture electronic substrates, such that the Coefficient of Thermal Expansion (CTE) differential between the electronic substrate and the electronic components thereon is reduced or eliminated. CTE differentials result in stresses on the solder joints (e.g., solder joints that connect electronic components with the electronic substrate) in thermal cycling. These stresses can cause the solder joints to fail, and such solder joint failure is often the limiting factor for extending the reliability of electronic assemblies. The reduction or elimination of the CTE differential between the electronic substrate and the electronic components provides for the formation of soldered electronic assemblies (i.e., electronic substrates including electronic components soldered thereon) that are capable of operation for at least 1000 hours in relatively high-temperature down hole and/or other extreme environments without failure of the soldered electronic assemblies (i.e., without failure of the solder joints). In some aspects, the electronic substrates and components are tested to ensure suitable thereof for at least 1,000 hours of operation at high temperatures (e.g., down hole and/or other extreme environment temperatures) without failure of solder joints. The minimization of stresses on the solder joints by reducing or eliminating the CTE differentials provides for operation of the electronic substrates and components under such conditions.

In some aspects, the electronic substrates disclosed herein are at least partially, or fully, composed of material(s) having properties tailored to eliminate stresses in the electronic substrates. For example, and without limitation, in some aspects the electronic substrates disclosed herein are at least partially, or fully, composed of materials, such as ceramic materials that have the same or substantially the same CTE (linear and/or volumetric) as the electronic components attached thereto. With the same or substantially the same CTE as the electronic components attached thereto, mismatch between the CTE of the electronic components and the CTE of the electronic substrate is reduced or eliminated. The electronic substrate may have a CTE that is within 10%, or 9%, or 8%, or 7%, or 6%, or 5%, or 4%, or 3%, or 2% of that of the CTE of the electronic components attached thereto. For example, if an electronic component has a linear CTE of 17, then an electronic substrate having a CTE within 10% of the electronic component will have a CTE that ranges from 15.3 to 18.7. With such mismatch of CTE reduced or eliminated, soldered assemblies including the electronic substrates and components disclosed herein may operate in extreme thermal environments for longer periods of time without failure (e.g., failure of solder joints), in comparison with electronic substrates having CTEs that are not the same or substantially the same as the electronic components attached thereto. For example, in some aspects, soldered assemblies including the electronic substrates and components disclosed herein may operate in extreme thermal environments, such as downhole or other extreme, high-temperature environments, for at least 1000 hours prior to failure (e.g., failure of solder joints). In some applications, the CTE mismatch between electronic substrates and electronic components creates stresses on solder joints in thermal cycling. These stresses can cause the solder joints to fail, and solder joint failure is often a limiting factor for extending the reliability of electronic assemblies. In some such aspects, the electronic assemblies (i.e., electronic substrates with electronic components thereon) exhibit minimized stress on the solder joints due to the components and substrates having the same or substantially the same CTE.

Additive Manufacturing Features in the Electronic Substrates

Figures 5A, 5B, 5C, 5D:
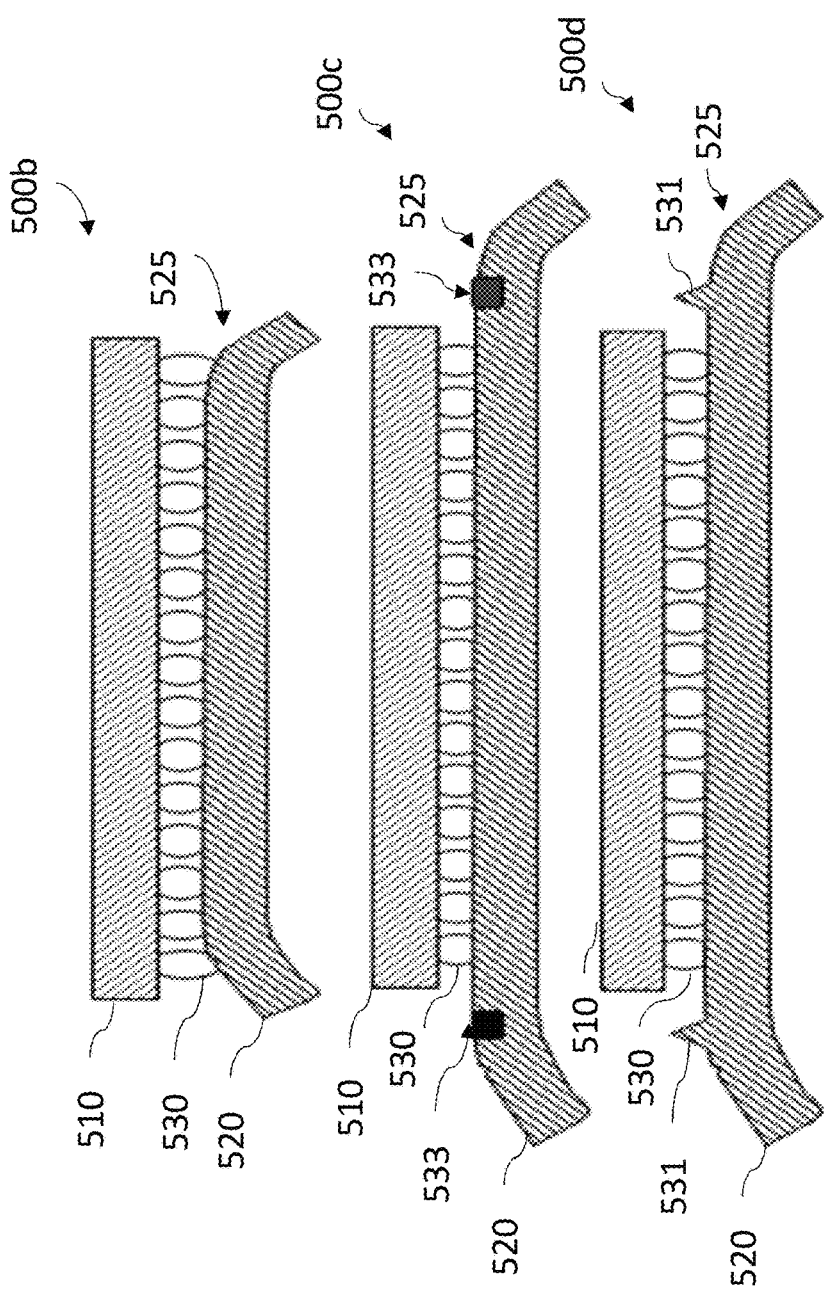
FIG. 5A depicts an electronic substrate including reinforcing bosses and stiffeners.
FIGS. 5B-5D depict electronic assemblies with and without strength enhancing features.

With the near net shape additive manufacturing techniques disclosed herein, various features, such as reinforcements and localized structural properties, can be introduced where needed in the assembly. For example, material that, when sintered, provides rigidity or other reinforcing or structural properties as desired, is deposited at a desired location(s) and is then sintered to form reinforcements and/or localized structural elements within the electronic substrate. As such, the use of external frames in the electronic substrates can be reduced or eliminated, as these reinforcements and/or localized structural elements are formed integral with the electronic substrates. FIG. 5A depicts electronic substrate 500a with reinforcing bosses 531 and stiffeners 533 integrally formed therewith via the depositing and sintering processes disclosed herein. Reinforcing bosses 531, stiffeners 533, and/or other such features can be integrally built into the electronic substrates disclosed herein, such as to alter the effects of bending from shock.

FIGS. 5B-5D are simplified depictions of assemblies with and without strength enhancing features. In FIG. 5B, assembly 500b does not include any strength enhancing features, such as stiffeners or bosses. Assembly 500b includes BGA 510 coupled with PWB 520 via solder balls 530. As is evident from FIG. 5B, solder balls 530 are subjected to deformation near the edge of BGA 510 due to bending of PWB 520. Without a stiffener or boss, the bend 525 of PWB 520 begins closer to the edge of the BGA 510 than with a stiffener or boss. Localized stiffening of PWB 520 may be achieved by adding stiffeners or bosses to the PWB 520, resulting in the relative movement of the origin of the bend away from the solder joints 530; thereby, increasing the lifetime of the solder joints 530. For example, FIG. 5C depicts assembly 500c including stiffeners 533, and FIG. 5D depicts assembly 500d including bosses 531. Such stiffeners 533 and/or bosses 531 may be integrally AM formed with the PWB 520, may be embedded within or on a surface of PWB 520, and may have any shape, size, or position on PWB 520. Such AM formed reinforcing bosses or stiffeners in or on the PWB 520 may replace the use of cross beams and provide localized resistance to bending to the PWB 520 and may be 3D printed at any location on the PWB 520 to facilitate such bending resistance. For example, in some aspects, the strength enhancing features that is integrally AM formed with the PWB 520 is in the form of a frame around components on the PWB 520 or is positioned below the components on the PWB 520.

In some embodiments, separate laminates are printed onto or over the electronic substrates disclosed herein. For example, as shown in FIG. 6, an electronic substrate 600 in accordance with FIG. 3C has laminate 632 printed thereon. Such laminates may be printed onto or over the substrates disclosed herein by powder deposition and sintering, material extrusion, or any of various methods known to those skilled in the art. However, in other embodiments, the method does not include the printing of separate laminates onto or over the electronic substrates disclosed herein, but rather includes the introduction of the materials for each component, element, and layer of the electronic substrates, such as a powder form or ink form, that is then sintered and/or otherwise cured or formed in place as it is deposited.

The additive manufacturing techniques disclosed herein may be used to integrally build, layer-by-layer, wires into the electronic substrate, including shielded wires. For example, powder for the shielding and wire may be deposited and sintered in the desired position in or on the body of the electronic substrate in an order such that the resultant shielded wire is formed. With reference to FIGS. 7A and 7B, the additive manufacturing of electronic substrate 700 including shielded wire 745 is depicted. In FIG. 7A, the electronic substrate body 741, shield 743, and wire 745 are partially deposited and, optionally sintered. After further deposition and sintering of material, electronic substrate body 741, shield 743, and wire 745 are fully formed such that wire 745 is fully shielded by shield 743. Shield 743 may be the same material as body 741 or may be a different material. One skilled in the art would understand that the same or substantially the same manufacturing techniques may be used to form: twisted wire pairs with shielding in or on the electronic substrates, such that the wires are isolated; coax cable connections in or on the electronic substrates, by integrally building the core, insulator, shield, and jacket; and wrapped inductor cores in or on the electronic substrates, by integrally building the inductor core and wire wrapping. As such, the additive manufacturing techniques disclosed herein may be used to directly deposit and form electronic substrates with integral conductive interconnects.

Figure 8B:
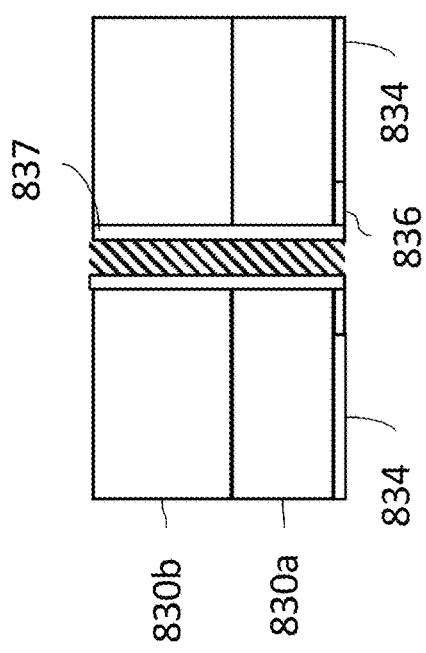
FIGS. 8A-8C depict the sequential build-up of an electronic substrate.
Figure 8C:
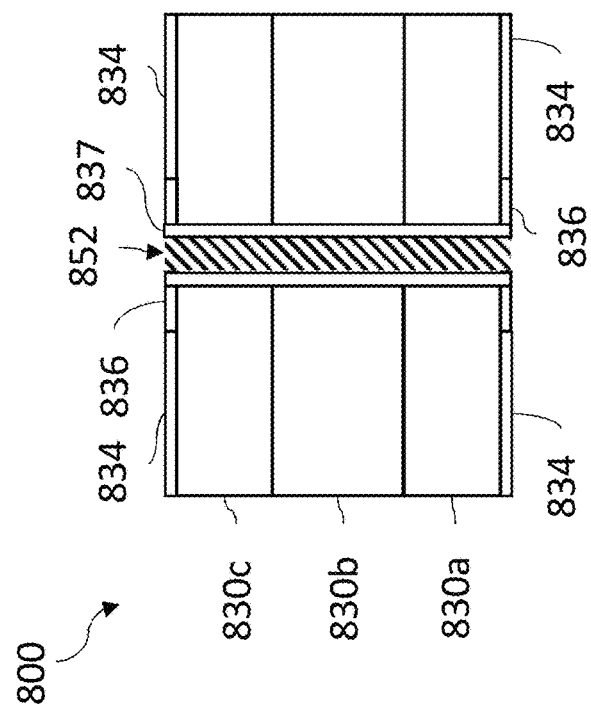
Figure 8A:
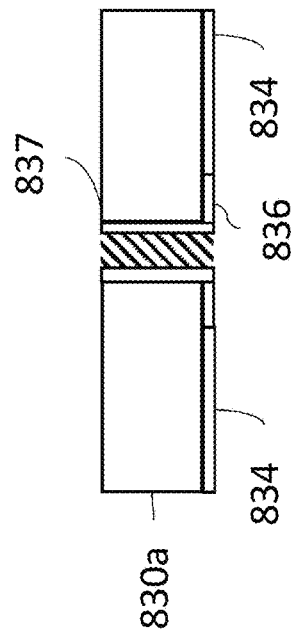

As the electronic substrates disclosed herein are manufactured on a layer-by-layer basis, the positional relationship of different elements, components, and/or layers of the electronic substrates can be precisely controlled such that the elements, components, and/or layers are aligned as desired. For example, the traces, vias, capture pads, and any other such components typical of electronic substrates may be formed integrally with the body of the electronic substrate using the material deposition and sintering techniques disclosed herein. As the body of the electronic substrate, and each element, component, and/or layer thereof, is manufactured layer by layer by building up and sintering the deposited material for each on the same platform and/or with the same mold, the alignment of the, for example, traces, vias, capture pads, and other such components is ensured. For example, FIGS. 8A-8C depict the layer by layer manufacture of an electronic substrate 800. With reference to FIG. 8A, traces 834, first layer of electronic substrate body 830a, and a portion of via pad 836 is shown manufactured. The via is composed of pads 836, barrel 837, and through-hole 852. With reference to FIG. 8B, second layer of electronic substrate body 830b, and an additional portion of via pad 836 is shown manufactured. With reference to FIG. 8C, additional traces 834 may, third layer of electronic substrate body 830c, and the final portion of via pad 836 is shown manufactured. When formed, through-hole 852 of via pad 836 extends from first layer 830a to third layer 830c. As would be understood by one skilled in the art, layers 830a-830c may be electrically non-conductive, while traces 834 and via pad 836 may be electrically conductive. Thus, progressing layer-by-layer provides for the precise positional arrangement of the various components, elements, and layers of electronic substrate 800. While shown as a three-layer construction for the purposes of explanation, one skilled in the art would be understood that the manufacture of the electronic substrates disclosed herein may require more than three layers of deposition and sintering to construct. While shown as including one, through-hole via, one skilled in the art would understand that blind and buried vias may also be built into and concurrently with the electronic substrates disclosed herein. Furthermore, in some embodiments, the method includes filling the blind and/or buried vias filled with conductive materials, such as the same conductive material that is used to form the traces. As such, coefficient of thermal expansion (CTE) mismatch between these components can be reduced or eliminated.

As through-holes can be integrally built within the electronic substrates disclosed herein during the material deposition and sintering process, in some aspects the electronic substrates disclosed herein are manufactured without the use of drilling, drill bits, and/or other drill equipment. However, in other aspects, drilling, drill bits, and/or other drill equipment are used in post-processing steps (i.e., after the electronic substrate has been formed via AM processing) of the formation of the electronic substrates disclosed herein.

Furthermore, as the vias are formed using layer-by-layer deposition and sintering, plating is not used to fill the vias and create through-hole barrels. For example, with reference to FIG. 8C, via pad 836 includes barrel 837, which is positioned within through-hole 852 and manufactured layer-by-layer with the other portions of electronic substrate 800. The elimination of plating and the layer-by-layer manufacturing of vias provides for the building of vias and through-hole with diameters and spacings that are reduced relative to diameters and spacings attained by current industry practices. In some such aspects, smaller diameter vias and through-holes provides for additional space for routing traces on the electronic substrate between the vias and through-holes; thereby, providing for a higher-density routing of fine pitch component interconnections in fewer layers than is attained by current industry practices.

Furthermore, de-smear chemical and resin residues can interfere with plating. The elimination, or at least reduction, in the use of plating and drilling to form the electronic substrates disclosed herein provides for a corresponding elimination, or at least reduction, in the occurrence of potential plating and desmear caused defects being exhibited in the electronic substrates.

The ability to selectively deposit different materials in different positions along the x-, y-, and z-axis using the AM material deposition techniques disclosed herein provides for the selective positioning of components within the electronic substrates disclosed herein. For example, solder pads and/or other interconnections can be placed on any side of the electronic substrate; traces can be run in any direction, including diagonally through the substrate, and not just in the x-, y- and z-directions.

The use of the additive manufacturing techniques to manufacture the electronic substrates disclosed herein allows the design of the electronic substrates to be easily modified, without the need to fabricate any new tooling for manufacturing the electronic substrates, as only the design file (STL file) associated with the electronic substrates needs to be changed to change the design.

Build-Up Conductive Interconnect

In some embodiments of the methods disclosed herein, the interconnections between the electronic components and the substrate are integrally built up using the deposition and sintering techniques disclosed herein (also referred to herein as build-up conductive interconnect or BUCI). The building up of the interconnections between the electronic components and the substrate provides for the reduction or elimination of solder joints in the electronic substrates and assemblies. Thus, in some aspects, the present disclosure provides for deployable and functional electronic substrates and assemblies that lack (do not include) solder joints.

In some such aspects, the method includes depositing dielectric materials in or on the substrate body having CTEs tailored for attachment of dies (i.e., of an integrated circuit) and electrically conductive materials thereto for interconnection with electronic components. Such embodiments allow for the direct metal interconnect of components to the electronic substrate. Using the same materials to form the interconnections and electronic components can minimize the brittle intermetallic formations and depletion and diffusion reactions that often contribute to failures of electronic substrates or components thereof.

In some such embodiments, electronic component leads are formed onto pads. The pads are printed (i.e., 3D printed via deposition and sintering) with conductive materials that match the materials of the electronic component leads. This minimizes intermetallic growth between the electronic component leads and the pads. In such embodiments, laser heat may be applied to attach the electronic component leads to the pad of the electronic substrate. For example, with reference to FIG. 4A, pads of vias 420 may be 3D printed by depositing and sintering conductive materials that match the materials of the electronic component leads, such as traces 422 extending between the pads of vias 420 and electronic components 418. Laser heat may then be applied to attach the electronic component leads (i.e., traces 422) to the pad of the electronic substrate (i.e., the pads of vias).

In other such embodiments, the method includes positioning a die (e.g., of an integrated circuit) directly on the electronic substrate and 3D printing the attachment from the die pads to the traces; thereby, reducing or eliminating the need for wire bonding to be performed.

The electronic substrates and assemblies thereof manufactured by the additive manufacturing processes disclosed herein may be used to facilitate the interconnection (e.g., electrical coupling) of various different electronic components thereon, as well as the connection (e.g., electrical coupling) of such electronic components with electronic components on other electronic substrates or assemblies. In addition, the additive manufacturing processes disclosed herein provide for the formation of various features in, on, or of the electronic substrates including, but not limited to: solder pads and other electronic or thermal interconnections or components, which can be positioned on any side of the electronic substrate; traces or other wires, which can be extended in any direction on the electronic substrate, including diagonally, in the x-direction, in the y-direction, and/or in the z-direction; twisted wire pairs and shielding, which can be integrally built into the electronic substrate to isolate the wires; coax cable connections, which can be integrally built into the electronic substrate; inductor cores and associated wraps, which can be integrally built into the electronic substrate; reinforcing bosses, stiffeners, or other structural features, which can be integrally built into the electronic substrate to alter the effects of bending from shock; and design modifications of the electronic substrate, which can be implemented without the need to fabricate any tooling, such as by modifying a design file (STL file) associated with the electronic substrate.

Hardware, Software, and Materials

The additive manufacturing processes disclosed herein may be implemented using additive manufacturing machines (e.g., 3D printers) that are capable of depositing multiple materials during the deposition and sintering steps to build-up the electronic substrates. In some aspects, the AM process is carried out in an inert atmosphere (e.g., in the absence of oxygen) to prevent oxidation of metal materials that are deposited on the electronic substrate and sintered. For example, metal powders may be deposited to form traces and/or contact pads on the electronic substrate, which may be subject to oxidation in the presence of oxygen.

As would be understood by one skilled in the art, use of such additive manufacturing machines includes the use of computer aided design (CAD) software to form 3D models of proposed designs for the electronic substrates. STL files output from these 3D model design files may be downloaded to a 3D printer and run thereon to manufacture an electronic substrate in accordance with the design.

The additive manufacturing machines (e.g., 3D printers) suitable for use herein include those that are capable of 3D printing and curing multiple types of materials including, but not limited to, ceramics; polymers, including relatively high-temperature engineering resins such as polyether ether ketone (PEEK); metals and metal alloys, such as tungsten, silver, copper; various other conductive materials, such as carbon; and a variety of other materials that are typically used in the construction of electronic substrates. Thus, in some aspects, the electronic substrates manufactured herein are at least partially composed one or more of these materials. The materials used in the additive manufacturing of the electronic substrates disclosed here may be in the form of powders, mixtures of powders, and/or powder slurries. In some aspects, where ceramic materials are used to form at least a portion of the electronic substrates disclosed herein, the ceramic materials are deposited in a "green" state as a relatively weakly bonded powder, which is then compressed during a final densification and sintering step.

In some aspects, rather than using lasers, a different energy source may be used to sinter or melt the deposited material. For example, an electron beam (e-beam) may be used to sinter or melt the depositing material.

In certain embodiments, the method includes using a combination of the 3D printing process disclosed herein and a laminar process to manufacturing printed wiring boards. In some such embodiments, layers of the electronic substrate are separately built up via the 3D printing process disclosed herein, and then the separately manufactured layers are bonded together to form an electronic substrate. The separately manufactured interconnecting layers may be formed by drilling vias and plating (e.g., to form via barrels). In some such aspects, thin film or thick film processes are used to separately manufacture thin or thick layers of the electronic substrate.

In certain embodiments, the method includes using the 3D printing processes disclosed herein to build up dielectric layers of the electronic substrate, in combination with the use of vapor deposition (e.g., chemical vapor deposition, CVD) of conductive materials, such as to form traces, vias, and other electrically conductive portions of the electronic substrate. As would be understood by one skilled in the art, the use of such vapor deposition techniques may include the use of masks or masking to control where the deposition of vaporized material occurs on the electronic substrate. Furthermore, as would be understood by one skilled in the art, the use of such vapor deposition techniques may include the use of subtractive processes to remove undesired material deposited by vapor deposition to form the desired component with the desired shape and position, such as to form traces, vias, and other electrically conductive components on the electronic substrate at the desired location and of the desired shape.

Modifications of Soldered Components

In some aspects, the AM methods disclosed herein may be used to manufacture modified soldered electronic substrates and assemblies. In some such embodiments, the method includes providing an existing electronic substrate, either manufactured in accordance with the present AM methods or via a conventional manufacturing method. The method can include using TLPS and/or plating applications on electronic components that are soldered onto PWB. For example, material (e.g., TLPS material) may be 3D printed (deposited) onto existing electronic component pads, and then sintered thereon in accordance with the AM methods disclosed herein. The modified electronic component pads may then be attached to an existing PWB using soldering techniques known to those skilled in the art. While described in relation to modification of electronic component pads, one skilled in the art would understand that the modification techniques herein discussed are not limited to use in modifying electronic component pads and may be applied to other electronic components or portions of electronic substrates.

Figure 9A:
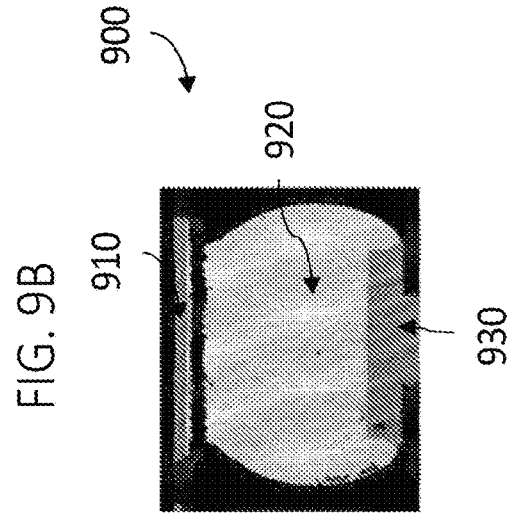
FIGS. 9A and 9B depict failure between a contact pad and solder.
Figure 9B:
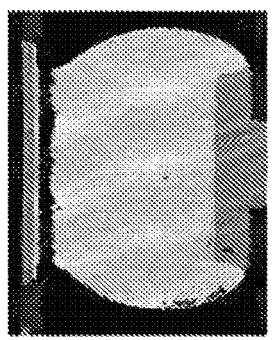

In some embodiments, the use of the AM methods disclosed herein provide the ability to change the otherwise typical locations of failures (e.g., solder failures) in electronic substrates and assemblies, such as by strengthening bonds at the electronic component and redirecting crack propagation. With reference to FIGS. 9A-10B, images exemplifying the changing of the typical location of failures, strengthening bonds at the electronic components, and redirecting crack propagation are depicted. FIG. 9A depicts a photograph of a failed ball grid array (BGA) 900 solder joint, and FIG. 9B is an annotated duplication of FIG. 9A including reference numerals for the purposes of explanation. Solder 920 is the weakest material in the joint between the component (here a contact pad 910) and substrate (here a printed wiring board 930). Thus, the failures of such joints most often occur along the interface between the solder 920 and the component, contact pad 910. In FIGS. 9A and 9B, the failure is evident by the black space between the contact pad 910 and the solder 920, showing the disconnection between these two elements.

Figure 10A:
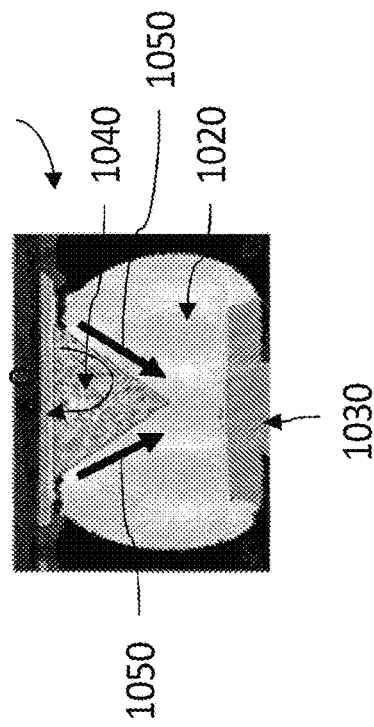
FIGS. 10A and 10B depict a 3D printed feature for mitigating failure between a contact pad and solder.
Figure 10B:
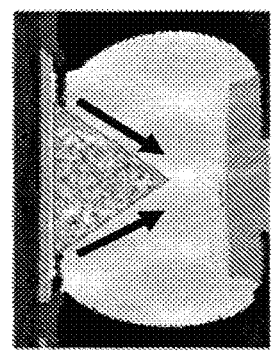

FIG. 10A depicts a photograph of a modified BGA 1000 solder joint, and FIG. 10B is an annotated duplication of FIG. 10A including reference numerals for the purposes of explanation. Solder 1020 forms the joint between the component (here a contact pad 1010) and substrate (here a printed wiring board 1030). Contact pad 1010 is modified to include surface feature 1040, which is, in this embodiment, a 3D printed protrusion extending from the surface of contact pad 1010 into solder 1020. While surface feature 1040 is shown as having the general shape of a triangle, one skilled in the art would understand that the surface feature is not limited to having this particular shape and may have any of numerous shapes depending on the particular application. Surface feature 1040 is a structure on contact pad 1010 configured (e.g., positioned, arranged, shaped, and/or sized) to direct any crack propagation to relatively lower stress regions of the solder joint 1020, as indicated by crack propagation pathways 1050. Thus, surface feature 1040 changes the direction of crack propagation and extends the length that a crack must travel before propagating from one side of solder 1020 to another side of solder. Surface feature 1040 is not limited to being a protrusion extending from the surface of contact pad 1010 and may be any feature that modifies the interfacing between solder 1020 and contact pad 1010, including features on contact pad 1010 that modify the total surface area of contact between contact pad 1010 and solder 1020.

Surface feature 1040 may be formed in accordance with the AM methods disclosed herein by depositing the material that surface feature 1040 is composed of (e.g., as a powder) onto contact pad 1010, followed by sintering the deposited material to consolidate the material into a solid structure.

Elimination or Minimization of Breakout

Figure 11D:
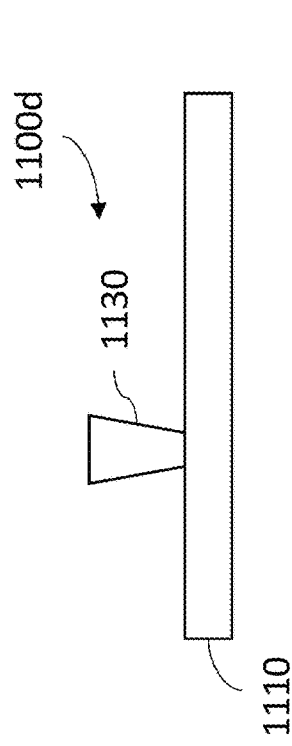
FIGS. 11A-11E depict breakout and 3D printed features that mitigate breakout.
Figure 11E:
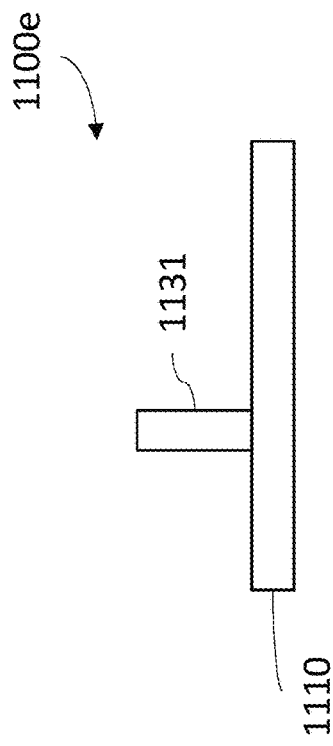
Figure 11A:
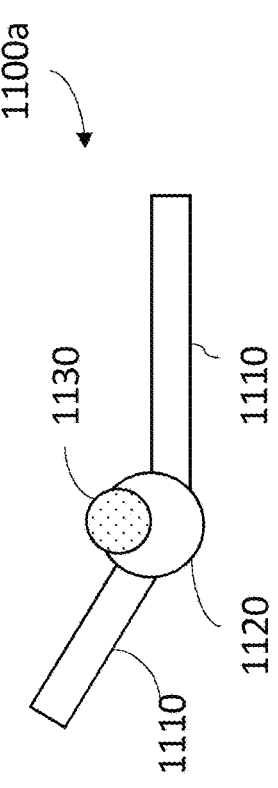
Figure 11B:
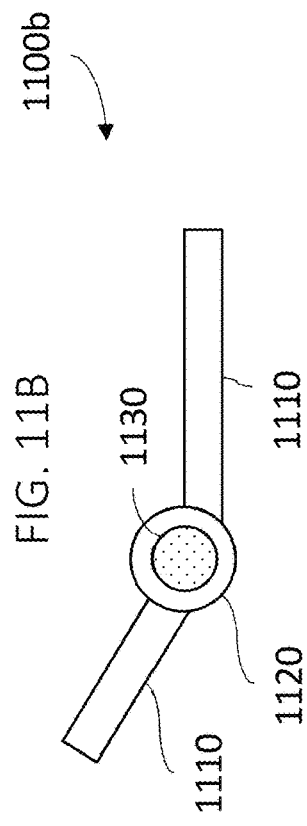

FIGS. 11A-11E depict views of capture pads. In particular, FIG. 11A depicts a top view of a conventionally manufactured electronic assembly 1100a with a capture pad 1120 coupled with traces 1110 in which break-out has occurred, FIG. 11B depicts a top view of a conventionally manufactured electronic assembly 1100b with a capture pad 1120 coupled with traces 1110 in which break-out has not occurred (i.e., it is aligned), and FIG. 11D depicts a side view of a conventionally manufactured electronic assembly 1100d. In such conventionally manufactured assemblies, capture pads are typically made larger than electrically needed to prevent the occurrence of breakout during drilling of hole 1130 and/or to prevent missing the pad during laser drilling. Breakout can occur during such drilling due to misalignment of sequential layers of the assembly. The occurrence of breakout limits the routing density in the substrate in order to maintain minimum spacing.

Figure 11C:
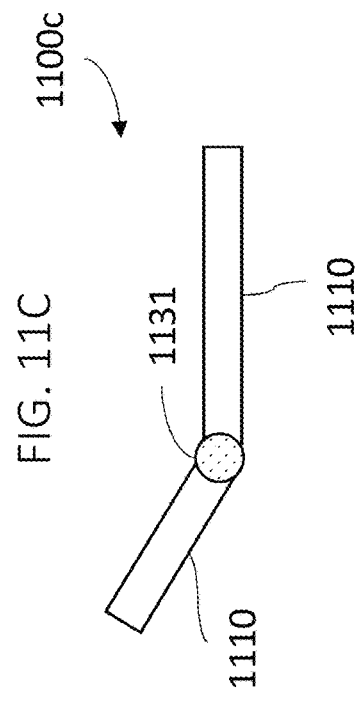

3D printing, such as the AM methods disclosed herein, can be used to maximize the routing density by elimination of and/or minimization of the capture pad dimensions required by such conventional substrate technologies. FIG. 11C depicts a side view of an electronic assembly 1100c manufactured in accordance with the AM methods disclosed herein, and FIG. 11E depicts a side view of an electronic assembly 1100e manufactured in accordance with the AM methods disclosed herein. With use of the AM methods disclosed herein the capture pads can be eliminated from the structure, as discussed elsewhere herein, and a smaller diameter hole 1131 can be provided in the assembly.

Exemplary Electronic Assembly

FIG. 12 is a cross-sectional view of an exemplary electronic assembly 1200 in accordance with certain aspects of the present disclosure, including substrate body 1202 having various features formed thereon, therein, or there-through, and which are attainable using the 3D printing techniques disclosed herein. Body 1202 may be formed of a dielectric material. In some aspects, body 1202 is formed of a material having sufficient dielectric strength to prevent shorting between conductors of assembly 1200. During printing, the dielectric material may provide support for the electrical conductors of assembly 1200. Also, the dielectric material may provide mechanical strength to assembly 1200 to hold the circuits thereof together during operation.

Assembly 1200 includes interconnections without capture pads 1219, 1224 and 1226. Assembly 1200 also includes shielded conductors 1211, 1234 and 1236, each of which includes shielding 1213 thereabout. Shielding 1213 may be the same material as body 1202 or a different material. Assembly 1200 includes coax interconnection 1232 for connection with the circuit. Shielding 1213 may circumferentially surround the conductors, and the dielectric material of substrate body 1202 may surround the shielding 1213. Shielding 1213 may be electromagnetic interference (EMI) shielding and/or radio frequency (RF) shielding. Such shielding is not limited to being positioned about individual circuits, and may be 3D printed around embedded dies, areas of a circuit that are radiation emitters, or areas of the circuit where stray energy tends to affect the functionality thereof.

Assembly also includes traces 1230 extending along the z-axis (e.g., extending out of the page).

Assembly 1200 includes filling 1214, such as polymeric or magnetic materials, surrounded by conductor 1212. In some aspects, magnetic filling 1214 may be surrounded by multiple loops of conductors 1212 to form embedded inductors. With the 3D printing techniques disclosed herein, inductors are not limited to a planar design.

Assembly 1200 also includes additional chip components soldered or connected to pads on the surface of body 1202, including electronic components 1210, 1216, 1218, and 1222. Assembly 1200 includes a ball grid array (BGA) package, BGA package 1220. In the embodiment of FIG. 12, BGA package 1220 is a surface mount (SMT) packaging for active components and memory. One skilled in the art would understand that the electronic substrates attainable by the methods disclosed herein are not limited to such packaging or components and may include other types of packaging and components. For example, area array packaging, quad-flat no leads (QFN) packaging, land grid array (LGA) packaging, chip scale packaging (CSP), leadless chip carrier packaging (LCC), and ceramic leadless chip carrier packaging (CLCC), as well as other features such as leaded gull wings, through-holes, and chip components may be included in assembly 1200.

Twisted Wire Pairs

Figure 13:
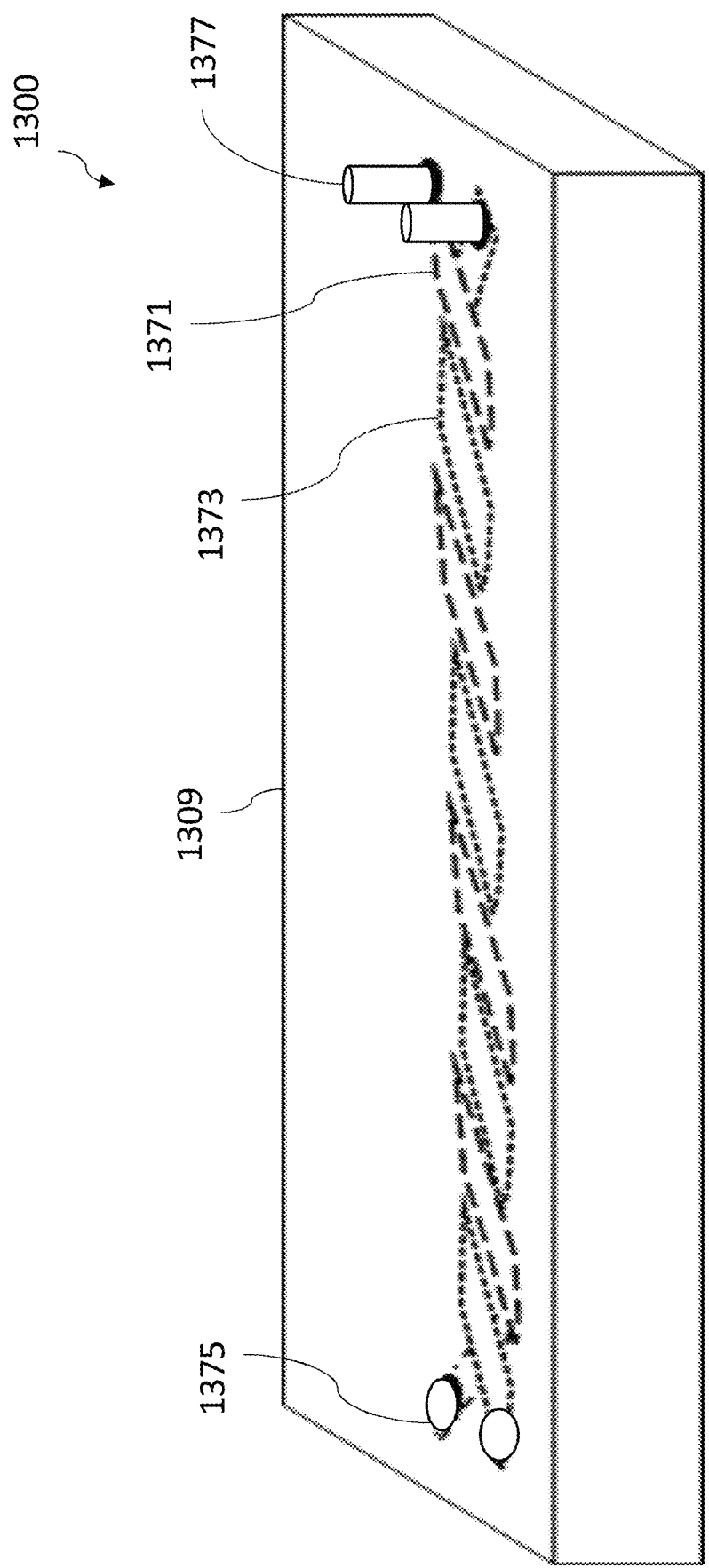
FIG. 13 depicts an exemplary electronic assembly with twisted wire pairs.

FIG. 13 depicts an exemplary assembly 1300 that includes substrate 1309 with twisted wire pair, formed of wire 1371 and wire 1373 positioned and arranged on and within substrate 1309 to twist about one another. While not in contact with one another, wires 1371 and 1373 are positioned and arranged in close enough proximity to ensure noise canceling effects. Wires 1371 and 1373 may, thus, be arranged to minimize electrical noise within the wires 1371 and 1373. The dielectric material of substrate 1309 surrounding the wires provides insulation between the wires 1371 and 1373. Such twisted wire pairs, as well as coax cables, may be connected to external components by connecting to vias 1375 and/or inserted or printed pins 1377. The twisted wire pairs may be on the surface of the substrate 1309 or may be embedded therein. Such twisted wire pairs may be formed by depositing material at a desired location that, when sintered, forms the twisted wire pairs.

Wire Wrapped Cores

Figure 14B:
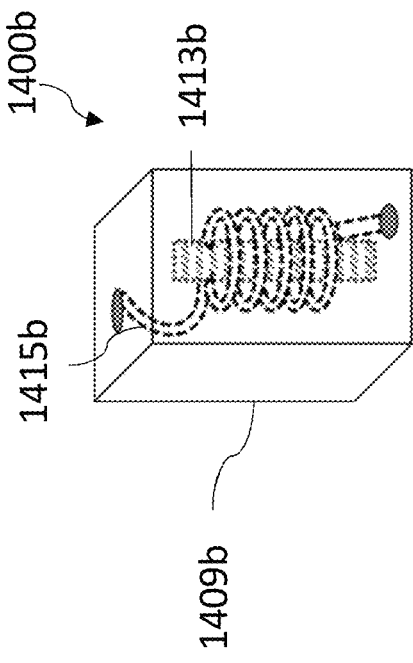
FIGS. 14A-14C depict exemplary electronic assemblies with wire wrapped inductor cores.
Figure 14A:
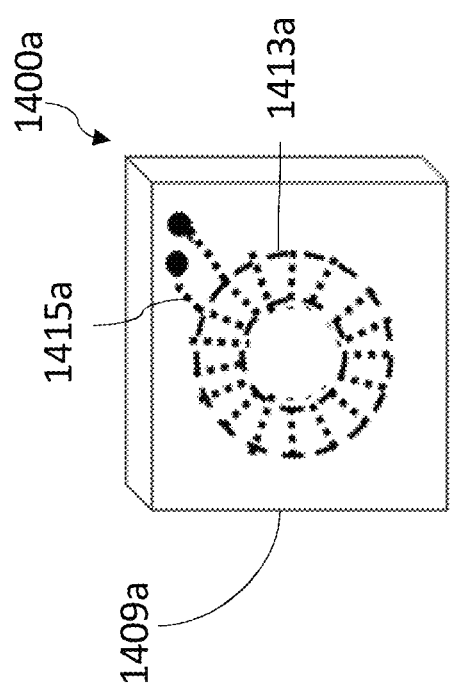
Figure 14C:
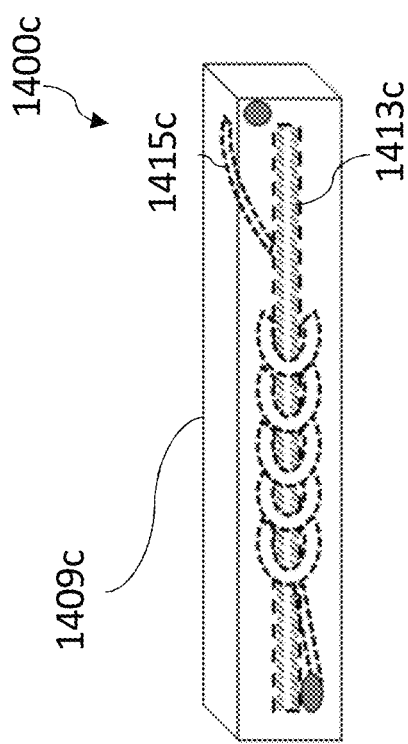

FIGS. 14A-14C depict three exemplary assemblies 1400*a*, 1400*b* and 1400*c* that include substrates 1409*a*, 1409*b* and 1409*c*, respectively. Each assembly 1400*a*, 1400*b* and 1400*c* includes a wire wrapped inductor core integrally 3D printed therein. The wrapped inductor core of assembly 1400*a* is formed of wire 1415*a* wrapped about core 1413*a*. The wrapped inductor core of assembly 1400*b* is formed of wire 1415*b* wrapped about core 1413*b*. The wrapped inductor core of assembly 1400*c* is formed of wire 1415*c* wrapped about core 1413*c*. One skilled in the art would understand that the present method is not limited to forming wrapped inductor cores in the shapes and arrangements shown in FIGS. 14A-14C, and that other shaped wrapped inductor cores may be formed using the methods disclosed herein. Such wire wrapped cores may be formed by depositing material at a desired location that, when sintered, forms the core and the wires.

Additional Exemplary Assembly

Figure 15B:
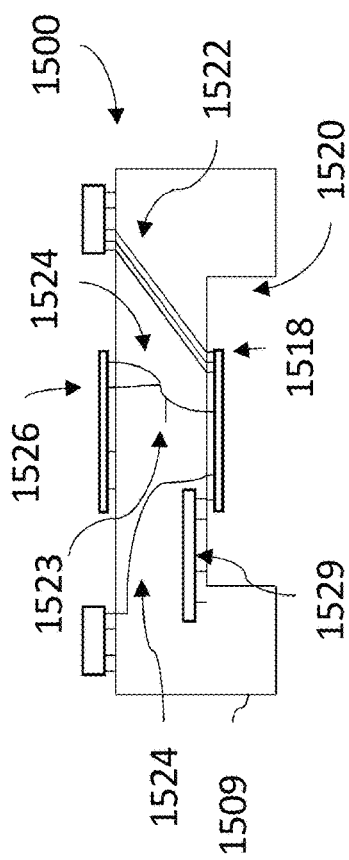
FIG. 15B depicts a side view of the electronic assembly of FIG. 15A.
Figure 15C:
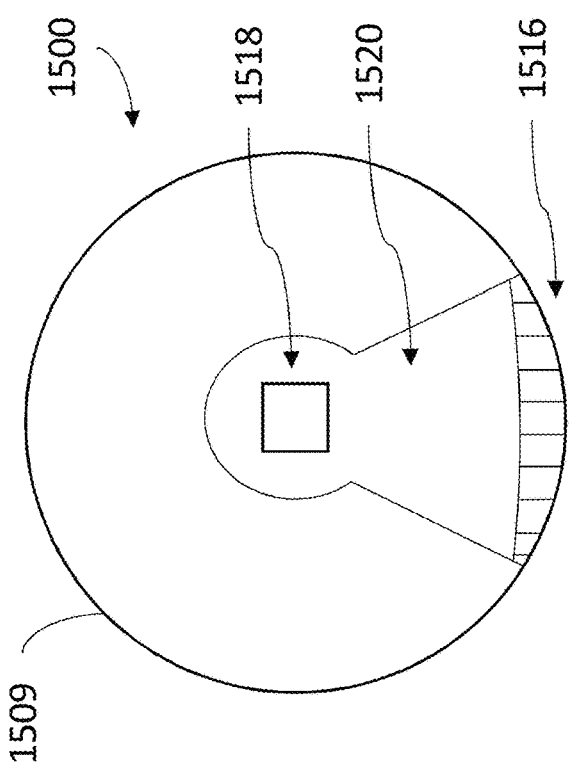
FIG. 15C depicts a bottom view of the electronic assembly of FIG. 15A.
Figure 15A:
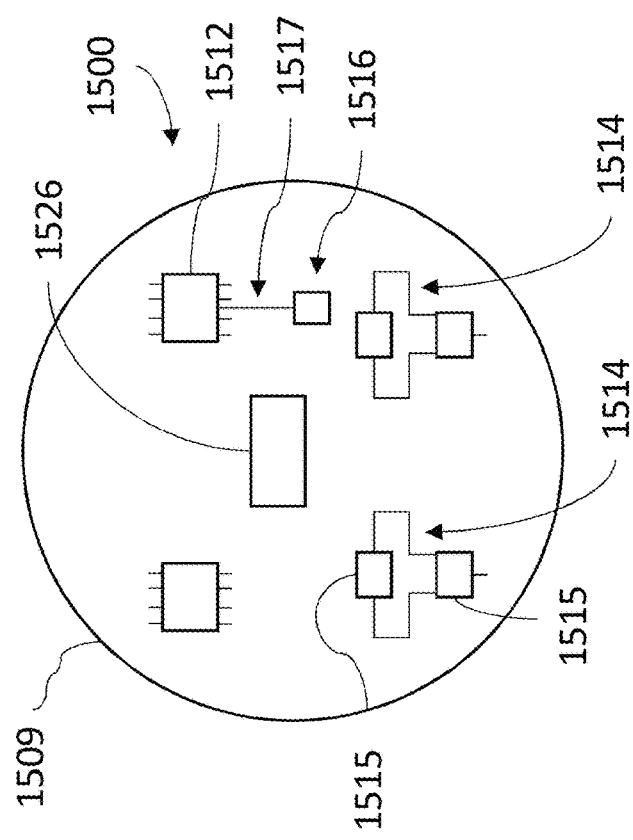
FIG. 15A depicts a top view of an exemplary electronic assembly with various 3D printed features.

FIGS. 15A-15C depict another exemplary substrate that may be formed in accordance with the present disclosure. Assembly 1500 includes substrate body 1509. As shown in FIGS. 15B and 15C, body 1509 may be formed with a cavity 1520 at selected locations by selectively not 3D printing material in those locations. One skilled in the art would understand that features other than cavities, including surface features and internal features may be provided within body 1509 by controlling where the material is 3D printed (i.e., by controlling the 3D CAD model of the substrate). Within the cavity 1520 are included metallized bond fingers 1516 for interconnections, and die 1518, each of which may be integrally 3D printed with body 1509.

Another exemplary feature that may be integrally 3D printed onto or into body 1509, as shown in FIG. 15A, is a 3D printed thermal sensor 1516, including traces 1517 that directly connect to electronic component 1512. Thermal sensor 1516 (thermistor) may be formed by 3D printing a different material than body 1509. For example, thermal sensor 1516 may be formed by 3D printing a material for which the correlation between resistance and temperature is relatively stable and controllable. Assembly 1500 may also include an array of antennas (e.g., bipolar antennas) 1514 associated with electronic components 1515. Antennas 1514, electronic components 1515, or combinations thereof may be integrally 3D printed with body 1509.

With reference to FIG. 15B, assembly 1500 includes conductive traces 1524, which may be integrally 3D printed with body 1509 as linear or curvilinear traces. The ability to 3D print relatively thin layers of body 1509, as well as any features integrally 3D printed therewith, provides the ability to form such relatively smooth curvilinear traces, as opposed to linear traces with more abrupt, step changes in the direction of extension of the traces. Assembly 1500 includes coaxial cable 1522 integrally 3D printed therewith. Coaxial cable 1522, as shown, includes three conductors. Between the conductors of coaxial cable 1522, as well as surrounding the conductors of coaxial cable 1522, insulative material may be 3D printed. In some such aspects, the insulative material is the same dielectric material as body 1509. In some aspects, a stub 1523 (e.g., a capacitor) may be formed in the body 1509, such as by 3D printing an additional conductor connected on one side only, which may replace a discrete component or embedded discrete component.

Assembly 1500 includes packaged component 1526 on a top body 1509 and embedded component 1529 embedded within body 1509. Thus, components may be 3D printed onto a surface of body 1509 or embedded therein. Embedded component 1529 may be directly sintered with die 1518.

While some of the components of assembly 1500 are shown as exposed in FIGS. 15A-15C, the components may also be embedded within body 1509, covered by additional 3D printed layers of body 1509, to provide shielding thereto.

Assemblies with Lids

In certain aspects, the AM techniques disclosed herein enable the manufacture of electronic substrates having features that provide for the bonding of lids to provide hermetic or near-hermetic protection for individual integrated circuits and/or multiple integrated circuits. FIG. 16 depicts another exemplary assembly in accordance with some embodiments of the present disclosure. Assembly 1600 includes a multi-layer substrate body (e.g., ceramic semiconductor packaging) including layers 1609*a*-1609*i*, with die 1613 positioned thereon. Die 1613 (embedded die) may be electrically coupled with one or more other portions of assembly 1600 via wires 1615. In other embodiments, die 1613 may be electrically coupled with one or more other portions of assembly 1600 via 3D printed traces (not shown) within one or more of the layers of assembly 1600. Traces (not shown) may connect the wire bond pads to external pin or solder pad (not shown).

Lid 1610 may be coupled onto one or more portions of multi-layer substrate body layers 1609a-1609i. For example, in some aspects, the ceramics, multi-layer substrate body is near hermetic and is sealed with a metal lid that is soldered thereon, such as using an Au/Sn solder. In some aspects, a ceramic or polymer lid is bonded onto one or more portions of multi-layer substrate body layers 1609a-1609i, such as using adhesives.

In some aspects, die 1613 is bonded on die pads (not shown) in a cavity 1611 of the multi-layer body. Wires 1615 may be bonded, followed by soldering lid 1610 into place. This technique reduces or eliminates issues associated with solder joints and CTE mismatch between the die and the packaging, and provides the ability to form relatively thin, multi-chip modules and electronic assemblies by moving the components below the surface and reducing or eliminating the use of metal frames.

Additional Features of Electronic Substrates Formed by AM Techniques

The 3D printing processes disclosed herein can be used to maximize the routing density of the electronic substrates by elimination of and/or minimization of the capture pad dimensions. That is, with no capture pads or at least smaller capture pads on the electronic substrate, less of the surface area of the electronic substrate is occupied by such capture pads. As such, more of the surface area of the electronic substrate is available for traces and other components; thereby, increasing the routing density relative to an otherwise identical electronic substrate with larger capture pads.

In certain embodiments, the materials used to form the electronic substrates, or portions thereof, are selected to provide the electronic substrates or portions thereof with a desired capacitance value tailored to the particular application. This can be achieved by selective deposition of the material at the selected positions in, on or of the electronic substrate, followed by sintering of the material.

Use of the additive manufacturing techniques disclosed herein to manufacture electronic substrates provides for improved electrical reliability of the resultant electronic assemblies by eliminating many of the defects that occur in printed circuit board production process. For example, and without limitation, in some embodiments the electronic substrates manufactured by the additive manufacturing techniques disclosed herein have a reduced or eliminated occurrence of: undercut; outgrowth; overhang; resin blistering; laminate voids; resin delamination; pad cratering; lifted land cracks; burrs; bond enhancement removal (pink ring); negative etchback; foil cracking; hole plating voids; wedge voids; glass fiber voids; glass bundle voids; severe etchback; nail heading; drill wall tears and/or wicking; hole wall pull away; corner cracks; copper blistering; burrs pushed into holes; glass fiber protrusions; innerlayer post separation; wicking; over plating resist voids; positive etchback; barrel cracks; shadowing; nodules; resin smear; copper and over plate voids; burned plating; copper foil contamination; lifted lands; resin crack delamination; crazing; foreign inclusions; prepreg voids; copper clad laminate voids; measling; resin recession; glass-weave texture; glass-weave exposure; or combinations thereof.

In some aspects, the electronic substrates and assemblies disclosed herein are coupled with or form a portion of a tool, such as a downhole tool. Use of the additive manufacturing techniques disclosed herein to manufacture electronic substrates provides for the reduction in the size of the electronic substrates and assemblies; thereby, providing for a reduction in the tool length and/or an increase in the functionality of the associated tool.

Thus, the present disclosure provides for the application of additive manufacturing process technologies to manufacture electronic substrates for electronic assemblies that provides for the formation of features in, on, or of the electronic substrates that are otherwise unavailable using current electronic substrate manufacturing techniques. By varying the position, composition, and amount of material deposited in the x, y, and z directions during the additive manufacturing, the electronic substrates may be integrally and custom designed and constructed to have any of numerous features, and properties at selected positions in or on the electronic substrate. Such varying of the position, composition, and amount of material deposited in the x, y, and z directions provides for the attainment of different properties at different positions in or on the electronic substrates. Such differing properties may be any of numerous physical, mechanical, electrical, and/or thermal properties, including electrical conductivity, electrical resistivity, electrical capacitance, thermal conductivity, thermal insulation, CTE, material density, material stiffness, material yield, material deflection, material elasticity, and material composition.

Thus, the additive manufacturing processes disclosed herein may be used to integrally build up electronic substrate bodies, components, wires, leads, traces, pads, vias, and other such electronic elements by selectively depositing selected and differing materials at selected and differing positions on a layer-by-layer basis and sintering or otherwise curing and/or fusing the materials.

Applications

The additive manufacturing methods disclosed herein may be used in the manufacture of a variety of substrates and components for use in a variety of applications, including products that use electronic assemblies. For example, the additive manufacturing methods disclosed herein may be used to manufacture printed circuit boards (PCBs), printed wiring boards (PWBs, including flex and rigid flex PWBs), printed wiring assemblies (PWA), multi-chip module (MCM) substrates, single chip module (SCM) substrates, interposers for electronic components, replacements for printed circuit boards, such as for high reliability applications, substrates with circuit interconnect structures allowing communication between electronic components of all types, wires, connectors, flex circuits, circuit boards, soldered electronic assemblies, and varied devices used to connect electronic components and circuitry to complete an electronic assembly.

3D electronic substrates (e.g., printed wiring boards) formed by the additive manufacturing methods disclosed herein may include structures integral therewith (and integrally formed therewith) that interconnect electronic components to form an electronic assembly (e.g., traces, pads, and/or vias), such as for gathering data and/or for operating electromechanical devices. The additive manufacturing methods may be used to build functional components on, in, or into the electronic substrates by 3D printing over the top of semiconductors, integrated circuits, resistive and/or other electronic materials.

The electronic substrates and assemblies manufactured by the additive manufacturing methods disclosed herein may be designed to be suitable for down hole and/or other extreme environments, including relatively high-temperature environments. For example, in some aspects, the electronic substrates and assemblies manufactured by the additive manufacturing methods disclosed herein may be designed to be suitable for use in environments that are at temperature ranging from about −65 to 300° C., or from about −40 to 200° C., or from about −40 to 150° C., or anywhere there-between, without failure of the electronic substrates and assemblies (e.g., without failure of the solder joints thereof).

In one example embodiment, a method of forming electronic substrates and assemblies is disclosed. The method may comprise forming a first layer, wherein forming the first layer comprises co-depositing a first material and a second material, wherein the first material and the second material are co-deposited as powders, binders, slurries, inks, or combinations thereof to form the first layer. Further, the method may comprise at least partially sintering or curing the first layer of co-deposited materials. Furthermore, the method may comprise forming a second layer, wherein forming the second layer comprises co-depositing the first material and the second material, wherein the first material and the second material of the second layer are co-deposited as powders, binders, slurries, inks, or combinations thereof to form the second layer. Moreover, the method may comprise at least partially sintering or curing the second layer of co-deposited materials. Additionally, the method may comprise retrieving a solid electronic substrate wherein the sintered or cured first material of the first layer forms the solid electronic substrate and the sintered or cured second material of the first layer forms a feature in or on the solid electronic substrate.

In another example embodiment, the method of forming electronic substrates and assemblies may be performed wherein the first material is an electrically insulative material and the second material is an electrically conductive material.

In another example embodiment, the method of forming electronic substrates and assemblies may be performed wherein the second material includes one of metal particles, an oxide, a boride, a phosphide, a carbide, or a metal-organic compound that increases the catalytic activity of the solid electronic substrate.

In another example embodiment, the method of forming electronic substrates and assemblies may be performed wherein the second material includes metal particles of one of ruthenium, rhodium, palladium, rhenium, platinum, osmium, iridium, gold, or silver.

In another example embodiment, the method of forming electronic substrates and assemblies may be performed wherein the second material includes an oxide of one of ruthenium (IV) oxide, rhodium (III) oxide, palladium (II) oxide, rhenium (VI) oxide, or platinum (IV) oxide.

In another example embodiment, the method of forming electronic substrates and assemblies may be performed wherein the second material includes a metal-organic compound including one of ruthenium, rhodium, palladium, rhenium, platinum, osmium, iridium, gold, or silver.

In another example embodiment, the method of forming electronic substrates and assemblies may be performed wherein forming the first layer further comprises co-depositing a third material with the first material and the second material, wherein the first material, the second material, and the third material of the second layer are co-deposited as powders, binders, slurries, inks, or combinations thereof to form the second layer, and wherein the first material is an electrically insulative material, the second material is an electrically conductive material, and the third material is one of metal particles, an oxide, a boride, a phosphide, a carbide, or a metal-organic compound that increases the catalytic activity of the solid electronic substrate.

In another example embodiment, the method of forming electronic substrates and assemblies may be performed wherein forming a second layer further comprises co-depositing the third material with the first material and the second material, wherein the first material, the second material, and the third material of the second layer are co-deposited as powders, binders, slurries, inks, or combinations thereof to form the second layer.

In another example embodiment, the method of forming electronic substrates and assemblies may be performed wherein the first material is an electrically insulative material, wherein the second material is an electrically conductive material, and wherein the third material includes metal particles of one of ruthenium, rhodium, palladium, rhenium, platinum, osmium, iridium, gold, or silver.

In another example embodiment, the method of forming electronic substrates and assemblies may be performed wherein the first material is an electrically insulative material, wherein the second material is an electrically conductive material, and wherein the third material includes an oxide of one of ruthenium (IV) oxide, rhodium (III) oxide, palladium (II) oxide, rhenium (VI) oxide, or platinum (IV) oxide.

In another example embodiment, the method of forming electronic substrates and assemblies may be performed wherein the first material is an electrically insulative material, wherein the second material is an electrically conductive material, and wherein the third material includes a metal-organic compound including one of ruthenium, rhodium, palladium, rhenium, platinum, osmium, iridium, gold, or silver.

In another example embodiment, the method of forming electronic substrates and assemblies may be performed wherein the first material, the second material, and the third material of the first layer include a mixture of at least three powders, binders, slurries, or inks having different melting points, and wherein the at least partially sintering includes transient liquid-phase sintering.

In another example embodiment, the method of forming electronic substrates and assemblies may be performed wherein the second layer is co-deposited on top of the at least partially sintered or cured first layer of co-deposited materials.

In another example embodiment, the method of forming electronic substrates and assemblies may be performed wherein the method further comprises completing the sintering or curing process for at least the first layer and the second layer.

In another example embodiment, the method of forming electronic substrates and assemblies may be performed wherein the solid electronic substrate is in the shape of a regular or irregular polygon, cylinder, cone, sphere, or torus.

In another example embodiment, the method of forming electronic substrates and assemblies may be performed wherein the solid electronic substrate includes at least one feature positioned on at least three sides of the solid electronic substrate.

In another example embodiment, the method of forming electronic substrates and assemblies may be performed wherein the second material of the first layer is a conductive material that, when sintered, forms a signal trace in or on the solid electronic substrate, a twisted wire pair, coaxial cable, or other wire.

In another example embodiment, the method of forming electronic substrates and assemblies may be performed wherein the second material of the first layer, when sintered, forms a thermal sensor in or on the solid electronic substrate, an antenna in or on the solid electronic substrate, a contact pad in or on the solid electronic substrate, or a via within the solid electronic substrate.

In another example embodiment, the method of forming electronic substrates and assemblies may be performed wherein the first material of the first layer is a ceramic material.

In another example embodiment, a method comprises deploying a solid electronic substrate formed as described above in a downhole well.

Although the present embodiments and advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a solid electronic substrate, the method comprising:
    forming a first layer, wherein forming the first layer comprises co-depositing an electrically insulative first material and an electrically conductive second material, wherein the electrically insulative first material and the electrically conductive second material are co-deposited as powders, binders, slurries, inks, or combinations thereof to form the first layer, and wherein at least one of the electrically insulative first material or the electrically conductive second material comprises a powder that is deposited and then subjected to compaction;
    at least partially sintering or curing the first layer of co-deposited materials;
    forming a second layer, wherein forming the second layer comprises co-depositing the electrically insulative first material and the electrically conductive second material, wherein the electrically insulative first material and the electrically conductive second material of the second layer are co-deposited as powders, binders, slurries, inks, or combinations thereof to form the second layer, and wherein the second layer is co-deposited on top of and contiguous with the at least partially sintered or cured first layer of co-deposited materials;
    at least partially sintering or curing the second layer of co-deposited materials; and
    retrieving a solid electronic substrate, wherein the sintered or cured electrically insulative first material of the first layer forms the solid electronic substrate, and the sintered or cured electrically conductive second material of the first layer forms a feature in or on the solid electronic substrate, and wherein the solid electronic substrate includes at least one feature positioned on at least three sides of the solid electronic substrate.

2. The method of claim 1, wherein the electrically conductive second material includes one of metal particles, an oxide, a boride, a phosphide, a carbide, and a metal-organic compound that increases a catalytic activity of the solid electronic substrate.

3. The method of claim 1, wherein the electrically conductive second material includes metal particles of one of ruthenium, rhodium, palladium, rhenium, platinum, osmium, iridium, gold, and silver.

4. The method of claim 1, wherein the electrically conductive second material includes an oxide of one of ruthenium (IV) oxide, rhodium (III) oxide, palladium (II) oxide, rhenium (VI) oxide, and platinum (IV) oxide.

5. The method of claim 1, wherein the electrically conductive second material includes a metal-organic compound including one of ruthenium, rhodium, palladium, rhenium, platinum, osmium, iridium, gold, and silver.

6. The method of claim 1, wherein forming the first layer further comprises:
    co-depositing a third material with the electrically insulative first material and the electrically conductive second material, wherein the electrically insulative first material, the electrically conductive second material, and the third material of the first layer are co-deposited as powders, binders, slurries, inks, or combinations thereof to form the first layer, and wherein the third material is one of metal particles, an oxide, a boride, a phosphide, a carbide, and a metal-organic compound that increases a catalytic activity of the solid electronic substrate.

7. The method of claim 6, wherein forming the second layer further comprises:
    co-depositing the third material with the electrically insulative first material and the electrically conductive second material, wherein the electrically insulative first material, the electrically conductive second material, and the third material of the second layer are co-deposited as powders, binders, slurries, inks, or combinations thereof to form the second layer.

8. The method of claim 6, wherein the third material includes the metal particles of one of ruthenium, rhodium, palladium, rhenium, platinum, osmium, iridium, gold, and silver.

9. The method of claim 6, wherein the third material includes the oxide of one of ruthenium (IV) oxide, rhodium (III) oxide, palladium (II) oxide, rhenium (VI) oxide, and platinum (IV) oxide.

10. The method of claim 6, wherein the third material includes the metal-organic compound including one of ruthenium, rhodium, palladium, rhenium, platinum, osmium, iridium, gold, and silver.

11. The method of claim 6, wherein the electrically insulative first material, the electrically conductive second material, and the third material of the first layer include a mixture of at least three powders, binders, slurries, or inks having different melting points, and wherein the at least partially sintering includes transient liquid-phase sintering.

12. The method of claim 1, wherein the method further comprises completing the sintering or curing process for at least the first layer and the second layer.

13. The method of claim 1, wherein the solid electronic substrate is in the shape of a regular polygon, an irregular polygon, or a cylinder.

14. The method of claim 1, wherein the electrically conductive second material of the first layer is a conductive material that, when sintered, forms a signal trace in or on the solid electronic substrate, a twisted wire pair, coaxial cable, or other wire.

15. The method of claim 1, wherein the electrically conductive second material of the first layer, when sintered, forms a thermal sensor in or on the solid electronic substrate, an antenna in or on the solid electronic substrate, a contact pad in or on the solid electronic substrate, or a via within the solid electronic substrate.

16. The method of claim 1, wherein the electrically insulative first material of the first layer is a ceramic material.

17. A method comprising:
deploying the solid electronic substrate formed in accordance with claim 1 in a downhole well.

* * * * *